US009052882B2

(12) United States Patent
Nitta et al.

(10) Patent No.: US 9,052,882 B2
(45) Date of Patent: Jun. 9, 2015

(54) BLOWER CONTROL DEVICE, BLOWER CONTROL METHOD, AND COMPUTER-READABLE RECORDING MEDIUM

(71) Applicant: FUJITSU LIMITED, Kawasaki-shi (JP)

(72) Inventors: Kazuhiro Nitta, Kawasaki (JP); Akira Ueda, Yokohama (JP); Atsushi Yamaguchi, Kawasaki (JP); Hiroyuki Furuya, Kawasaki (JP); Akihiro Otsuka, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 444 days.

(21) Appl. No.: 13/663,539

(22) Filed: Oct. 30, 2012

(65) Prior Publication Data

US 2013/0131886 A1 May 23, 2013

(30) Foreign Application Priority Data

Nov. 21, 2011 (JP) ................................. 2011-254448

(51) Int. Cl.
*G05B 13/02* (2006.01)
*G06F 1/20* (2006.01)
*H05K 7/20* (2006.01)

(52) U.S. Cl.
CPC ............ *G06F 1/206* (2013.01); *H05K 7/20209* (2013.01)

(58) Field of Classification Search
CPC ....... G06F 1/206; G06F 1/20; H05K 7/20209; B60K 11/04; B60K 1/04; B60Y 2200/143
See application file for complete search history.

(56) References Cited

U.S. PATENT DOCUMENTS

| 4,255,089 A * | 3/1981 | Phillips et al. ..................... 417/2 |
| 5,040,377 A * | 8/1991 | Braun et al. ..................... 62/183 |
| 5,287,244 A * | 2/1994 | Hileman et al. ......... 361/679.47 |
| 6,188,189 B1 * | 2/2001 | Blake ............................ 318/471 |
| 6,257,832 B1 * | 7/2001 | Lyszkowski et al. ............. 417/2 |

(Continued)

FOREIGN PATENT DOCUMENTS

| JP | 2-238195 | 9/1990 |
| JP | 2000-136798 | 5/2000 |

(Continued)

*Primary Examiner* — Robert Fennema
*Assistant Examiner* — Yagnesh J Trivedi
(74) *Attorney, Agent, or Firm* — Fujitsu Patent Center

(57) ABSTRACT

A blower control device changes a PQ characteristic in a second table so that an operating point $(Q_N, P_N)$ on the PQ characteristic in the second table agrees with an operating point $(Q_0, P_0)$ on a PQ characteristic in a first table. At this time, the blower control device changes the PQ characteristic in the second table at a rate based on $Q_N$ and $Q_0$. Furthermore, the blower control device changes a load noise characteristic in the second table at a rate based on $Q_N$ and $Q_0$. Then, the blower control device calculates load noise corresponding to the operating point $(Q_0, P_0)$ with respect to each rotation frequency ratio from the changed load noise characteristic. And then, the blower control device determines a rotation frequency ratio corresponding to the lowest load noise as a rotation frequency ratio at which a plurality of fans is rotated.

12 Claims, 16 Drawing Sheets

(56) References Cited

U.S. PATENT DOCUMENTS

| | | | |
|---|---|---|---|
| 6,398,505 B1* | 6/2002 | Sekiguchi | 417/2 |
| 6,407,918 B1* | 6/2002 | Edmunds et al. | 361/695 |
| 6,428,282 B1* | 8/2002 | Langley | 417/2 |
| 6,601,168 B1* | 7/2003 | Stancil et al. | 713/100 |
| 6,826,456 B1* | 11/2004 | Irving et al. | 700/299 |
| 6,935,130 B2* | 8/2005 | Cheng et al. | 62/259.2 |
| 7,059,830 B2* | 6/2006 | Huang et al. | 415/199.4 |
| 7,095,188 B1* | 8/2006 | Lin | 318/400.12 |
| 7,282,873 B2* | 10/2007 | Abali et al. | 318/41 |
| 7,527,468 B2* | 5/2009 | Hopkins | 415/1 |
| 7,617,019 B2* | 11/2009 | Leuschner | 700/300 |
| 7,643,291 B2* | 1/2010 | Mallia et al. | 361/695 |
| 2005/0232765 A1* | 10/2005 | Watanabe et al. | 415/220 |
| 2007/0081888 A1* | 4/2007 | Harrison | 415/47 |
| 2007/0089446 A1* | 4/2007 | Larson et al. | 62/259.2 |
| 2008/0065912 A1* | 3/2008 | Bodner et al. | 713/300 |
| 2008/0232974 A1* | 9/2008 | Tsuchiya | 417/14 |
| 2009/0037152 A1* | 2/2009 | Holahan et al. | 703/2 |
| 2009/0304199 A1* | 12/2009 | DeMoss | 381/71.1 |
| 2010/0028164 A1* | 2/2010 | Matsui | 417/2 |
| 2010/0068567 A1* | 3/2010 | Imai et al. | 429/13 |
| 2010/0076607 A1* | 3/2010 | Ahmed et al. | 700/276 |
| 2010/0296945 A1 | 11/2010 | Nitta et al. | |
| 2011/0000652 A1* | 1/2011 | Takada | 165/104.34 |
| 2011/0137621 A1* | 6/2011 | Holahan et al. | 703/2 |
| 2012/0017856 A1* | 1/2012 | Nicgorski | 123/41.11 |
| 2012/0164508 A1* | 6/2012 | Houchin-Miller et al. | 429/120 |
| 2012/0224322 A1* | 9/2012 | Artman et al. | 361/679.48 |

FOREIGN PATENT DOCUMENTS

| | | |
|---|---|---|
| JP | 2008-025983 | 2/2008 |
| JP | 2010-272704 | 12/2010 |

* cited by examiner

| AIR FLOW VOLUME Q m³/min | STATIC PRESSURE P Pa | SOUND PRESSURE LEVEL L dB(A) |
|---|---|---|
| 0 | 324 | 56.8 |
| 0.03 | 327 | 56.9 |
| 0.06 | 330 | 57.0 |
| 0.09 | 334 | 57.0 |
| 0.12 | 338 | 57.0 |
| 0.16 | 327 | 56.9 |
| 0.19 | 316 | 56.8 |
| 0.22 | 314 | 56.3 |
| 0.25 | 312 | 55.7 |
| 0.28 | 305 | 55.0 |
| 0.32 | 298 | 54.2 |
| 0.35 | 294 | 53.2 |
| 0.38 | 291 | 52.2 |
| 0.40 | 271 | 52.3 |
| 0.43 | 251 | 52.4 |
| 0.47 | 207 | 53.1 |
| 0.50 | 164 | 53.7 |
| 0.53 | 123 | 54.1 |
| 0.56 | 83 | 54.4 |
| 0.59 | 42 | 55.6 |
| 0.62 | 0 | 56.7 |

| AIR FLOW VOLUME Q m³/min | STATIC PRESSURE P Pa | SOUND PRESSURE LEVEL L dB(A) |
|---|---|---|
| 0 | 332 | 57.6 |
| 0.03 | 335 | 57.7 |
| 0.06 | 338 | 57.8 |
| 0.09 | 342 | 57.8 |
| 0.12 | 346 | 57.8 |
| 0.16 | 335 | 57.7 |
| 0.19 | 324 | 57.6 |
| 0.22 | 322 | 57.1 |
| 0.25 | 320 | 56.5 |
| 0.28 | 313 | 55.8 |
| 0.32 | 306 | 55.0 |
| 0.35 | 302 | 54.0 |
| 0.38 | 299 | 53.0 |
| 0.40 | 279 | 53.1 |
| 0.43 | 259 | 53.2 |
| 0.47 | 215 | 53.9 |
| 0.50 | 172 | 54.5 |
| 0.53 | 131 | 54.9 |
| 0.56 | 91 | 55.2 |
| 0.59 | 50 | 56.4 |
| 0.62 | 0 | 57.5 |

| Sr/Sf [%] | SOUND PRESSURE LEVEL [dB(A)] |
|---|---|
| 66 | 53.7 |
| 70 | 53.4 |
| 74 | 53.4 |
| 78 | 53.8 |
| 81 | 53.5 |
| 85 | 53.9 |
| 88 | 53.5 |

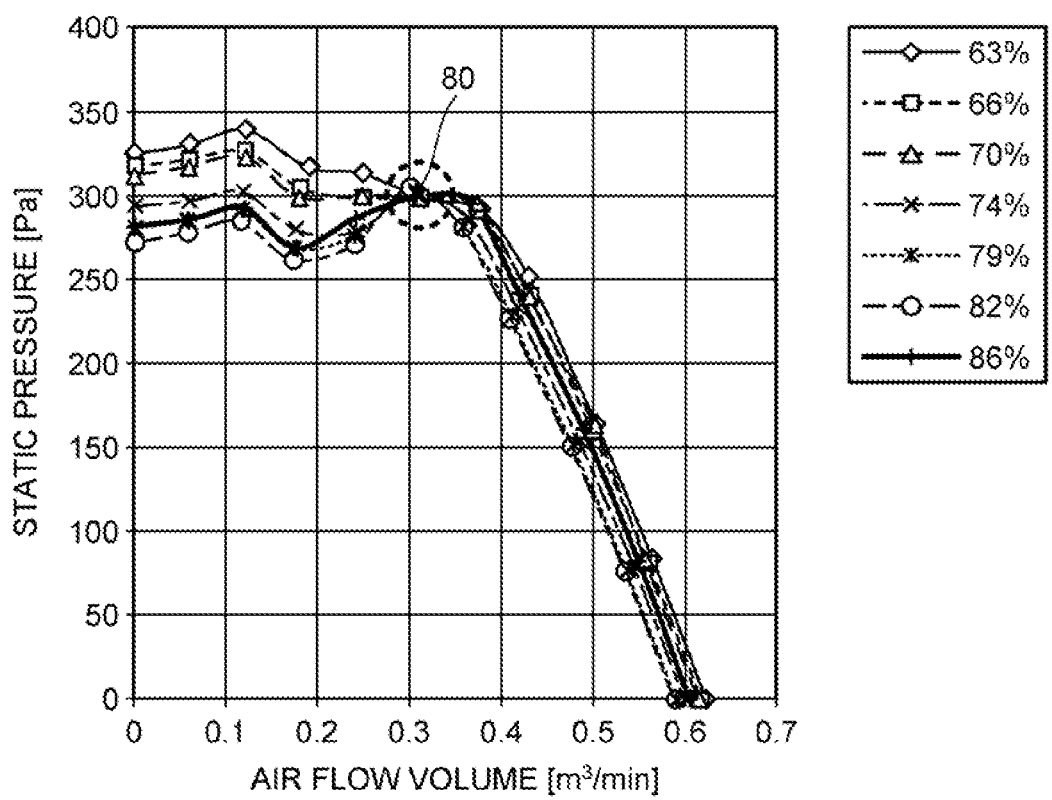

FIG.10A

| Sr/Sf [%] | SOUND PRESSURE LEVEL [dB(A)] |
|---|---|
| 69 | 52.2 |
| 72 | 52.6 |
| 76 | 52.4 |
| 80 | 52.6 |
| 83 | 53.0 |
| 86 | 52.3 |

FIG.10B

| Sr/Sf [%] | SOUND PRESSURE LEVEL [dB(A)] |
|---|---|
| 68 | 52.0 |
| 72 | 52.1 |
| 75 | 52.1 |
| 79 | 51.8 |
| 82 | 51.9 |
| 86 | 51.9 |

FIG.10C

| Sr/Sf [%] | SOUND PRESSURE LEVEL [dB(A)] |
|---|---|
| 66 | 53.8 |
| 70 | 54.0 |
| 74 | 53.1 |
| 79 | 52.4 |
| 82 | 52.4 |
| 86 | 53.0 |

BLOWER CONTROL DEVICE, BLOWER CONTROL METHOD, AND COMPUTER-READABLE RECORDING MEDIUM

CROSS-REFERENCE TO RELATED APPLICATION

This application is based upon and claims the benefit of priority of the prior Japanese Patent Application No. 2011-254448, filed on Nov. 21, 2011, the entire contents of which are incorporated herein by reference.

FIELD

The embodiments discussed herein are directed to a blower control device, a blower control method, and a blower control program.

BACKGROUND

Conventionally, an electronic device, such as a server or a personal computer (PC), may be equipped with a blower for blowing air into the inside of the device thereby releasing heat to the outside in order to prevent an increase in temperature of the inside of the device due to heat generation by a processor and the like.

A blower produces noise (wind noise) due to a vortex of air occurring near blades. The noise from the blower increases in proportion to a volume of air flow; therefore, when a higher volume of air flow is obtained by increasing a rotation frequency of the blower, this increases noise as well. Specifically, it is known that noise from a blower is proportional to the fifth to sixth power of an axial rotation frequency of the blower.

In recent years, electronic devices are set up in not only particular places, such as a computer room, but also general offices; therefore, there is a growing awareness of noise reduction. Thus, how to reduce noise from a blower is one of the important issues.

As a way to reduce blower noise, for example, there is known a method to monitor the temperature of a heat generating body and the environmental temperature and change a rotation frequency of a blower depending on these temperatures, thereby controlling not to increase the blower noise more than necessary. Incidentally, the control of blower rotation frequency is made by modulating the voltage or the pulse width (a PWM value) in pulse width modulation (PWM), thereby controlling energy to be supplied to a motor of the blower.

Meanwhile, in recent years, with the trend toward miniaturized, thinner electronic devices, some electronic devices have no ventilation flue within the device; therefore, there have been an increasing number of electronic devices that can have only a small blower. Furthermore, with the trend toward high-speed, high-performance electronic devices, an amount of heat generation of an electronic device tends to be increasing every year. Accordingly, electronic devices are designed to use a plurality of piled-up blowers so as to cool the inside of the electronic device sufficiently even if the electronic device can have only small blowers. For example, there is a technology to install two blowers, which are the same in air-flow direction but different in rotation direction, to be arranged in series in the air-flow direction so as to cool the inside of an electronic device sufficiently.

In this technology, to suppress noise produced by the blowers, rotation control of each of the two blowers is individually performed depending on a change in environmental temperature.

Incidentally, there is also known a technology to control a phase difference between two front and back blowers so as to reduce noise from the blowers on the basis of the number of blades, a rotation frequency, and a distance between rotor blades.

Patent document 1 Japanese Laid-open Patent Publication No. 02-238195
Patent document 2 Japanese Laid-open Patent Publication No. 2000-136798
Patent document 3 Japanese Laid-open Patent Publication No. 2008-25983

However, in the above-mentioned conventional technologies, there still remains a problem that noise produced by a blower cannot be suppressed. For example, a noise level of noise produced by a blower varies according to a system impedance of an electronic device, a PQ characteristic of the blower with respect to each ratio of respective rotation frequencies of two fans of the blower, and a load noise characteristic with respect to each rotation frequency ratio. However, in the above-mentioned technologies except Japanese Laid-open Patent Publication No. 2010-272704, the rotation control for suppressing noise produced by a blower is performed without consideration of this. Furthermore, in Japanese Laid-open Patent Publication No. 2010-272704, it is effective in blowers having the same shape and the same characteristic in rotation direction; however, there may be no effect when fans, which are the same in air-flow direction but different in rotation direction, are arranged in series in the air-flow direction. Accordingly, in the above-mentioned conventional technologies, suppression of noise is still insufficient, and further noise suppression is expected. Incidentally, the PQ characteristic indicates a relationship between static pressure and air flow. Furthermore, the load noise characteristic indicates a relationship between air flow and noise level. Moreover, the system impedance is also referred to as a "pipeline resistance".

Incidentally, in the above-described technology to control a phase difference between front and back blowers, frequency analysis of noise is performed when a phase difference is controlled. Therefore, if there are multiple noise sources other than the blowers, such as a processor and a hard disk drive (HDD), in an electronic device, it is difficult to extract only noise produced by the blowers, objects to be controlled, and perform frequency analysis of the extracted noise.

The present invention has been made in view of the above, and an object of the present invention is to provide a blower control device, blower control method, and blower control program capable of suppressing noise.

SUMMARY

According to an aspect of an embodiment, a blower control device includes a memory and a processor coupled to the memory. The memory stores therein a pipeline resistance of inside of a device, a static pressure-air flow volume characteristic with respect to each ratio of respective rotation frequencies of a plurality of blowers arranged in series with respect to a ventilation flue formed inside the device, and an air flow volume-noise level characteristic with respect to each of multiple different ratios of the rotation frequencies. The processor executes a process including determining a first air flow volume and a first static pressure of air flow through the ventilation flue on the basis of a static pressure-air flow volume characteristic corresponding to a ratio of predetermined rotation frequencies at which the blowers rotate, respectively, calculating a first noise level corresponding to the determined first air flow volume on the basis of an air flow volume-noise level characteristic corresponding to the ratio of the predetermined rotation frequencies, calculating a second air flow volume and a second static pressure of air flow through the ventilation flue when the blowers rotate at a rotation frequency ratio other than the ratio of the predetermined rotation frequencies with respect to each of the rotation frequency ratios other than the ratio of the predetermined rotation frequencies on the basis of respective static pressure-air flow volume characteristics at the rotation frequency ratios other than the ratio of the predetermined rotation frequencies out of the multiple different ratios of the rotation frequencies of the blowers, a relationship between air flow volume and static pressure which indicates the pipeline resistance, and the first air flow volume and the first static pressure, changing an air flow volume-noise level characteristic at a rotation frequency ratio other than the ratio of the predetermined rotation frequencies with respect to each of the rotation frequency ratios other than the ratio of the predetermined rotation frequencies on the basis of the first air flow volume and the second air flow volume, calculating a second noise level corresponding to the first air flow volume with respect to each of the rotation frequency ratios other than the ratio of the predetermined rotation frequencies on the basis of the changed air flow volume-noise level characteristic, and determining a rotation frequency ratio corresponding to the lowest noise level in the first and second noise levels as a rotation frequency ratio at which the blowers are rotated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9C is a diagram illustrating still another example of the process performed by the blower control device;

FIG. 10A is a diagram illustrating an example of correspondence between a calculated sound pressure level and a rotation frequency ratio;

FIG. 10B is a diagram illustrating another example of correspondence between a calculated sound pressure level and a rotation frequency ratio;

FIG. 10C is a diagram illustrating still another example of correspondence between a calculated sound pressure level and a rotation frequency ratio;

DESCRIPTION OF EMBODIMENTS

Preferred embodiments of the present invention will be explained with reference to accompanying drawings.

Incidentally, the present invention is not limited to the embodiments. The embodiments can be arbitrarily combined without being inconsistent with processing contents.

[a] First Embodiment

Figure 1:
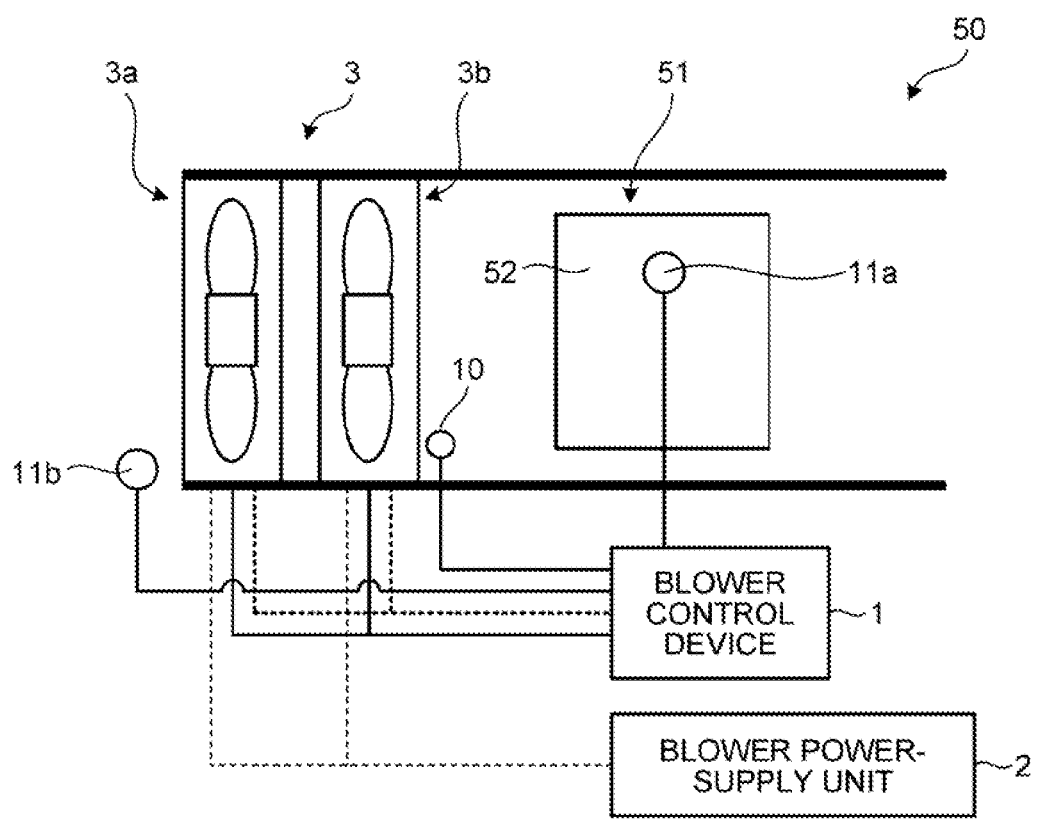
FIG. 1 is a diagram illustrating an example of a blower to be controlled by a blower control device according to a first embodiment.

A blower control device according to a first embodiment is explained. FIG. 1 is a diagram illustrating an example of a blower to be controlled by the blower control device according to the first embodiment. A blower control device 1 according to the present embodiment controls respective rotation frequencies of two fans 3a and 3b installed in an electronic device 50, such as a rack-mountable server or a general PC. First, a configuration of the electronic device 50 in which the blower control device 1 according to the present embodiment is installed is explained taking a counter-rotating fan as an example.

In the example illustrated in FIG. 1, the electronic device 50 includes a counter-rotating fan 3 and a heat generating body 52, such as a processor or an HDD, on a ventilation flue 51 formed in the electronic device 50.

In the example illustrated in FIG. 1, the counter-rotating fan 3 is an axial fan composed of the fans 3a and 3b which are the same in air-flow direction but different in rotation direction. The fans 3a and 3b are arranged in series with respect to the ventilation flue 51. The fans 3a and 3b generate an air current in a direction from the fan 3a toward the fan 3b, thereby cooling the heat generating body 52 placed on the downstream side of the air current.

Furthermore, the electronic device 50 includes the blower control device 1 and a blower power-supply unit 2 outside the ventilation flue 51. The blower power-supply unit 2 is a power supply that supplies electric power to respective motors (not illustrated) built into the fans 3a and 3b. Namely, when electric power is supplied to the fans 3a and 3b from the blower power-supply unit 2, the motors rotate. In accordance with the rotation of the motors, blades attached to the motors rotate, thereby the fans 3a and 3b generate an air current toward the heat generating body 52. Furthermore, in accordance with the rotation of the fans 3a and 3b, load noise is produced.

The blower control device 1 detects the speed of air flow from the counter-rotating fan 3 with an anemometer 10, and detects a volume of the air flow from the counter-rotating fan 3 on the basis of the detected air-flow speed. Furthermore, the blower control device 1 detects the temperature of the heat generating body 52 with a temperature sensor 11a. Moreover, the blower control device 1 detects the temperature around the fan 3a with a temperature sensor 11b. Then, on the basis of the temperatures detected with the temperature sensors 11a and 11b, the blower control device 1 controls respective rotation frequencies of the fans 3a and 3b so as to achieve a sufficient volume of air flow for cooling the heat generating body 52 in a state where a ratio of the rotation frequencies of the fans 3a and 3b is within a predetermined allowable range.

Figure 2:
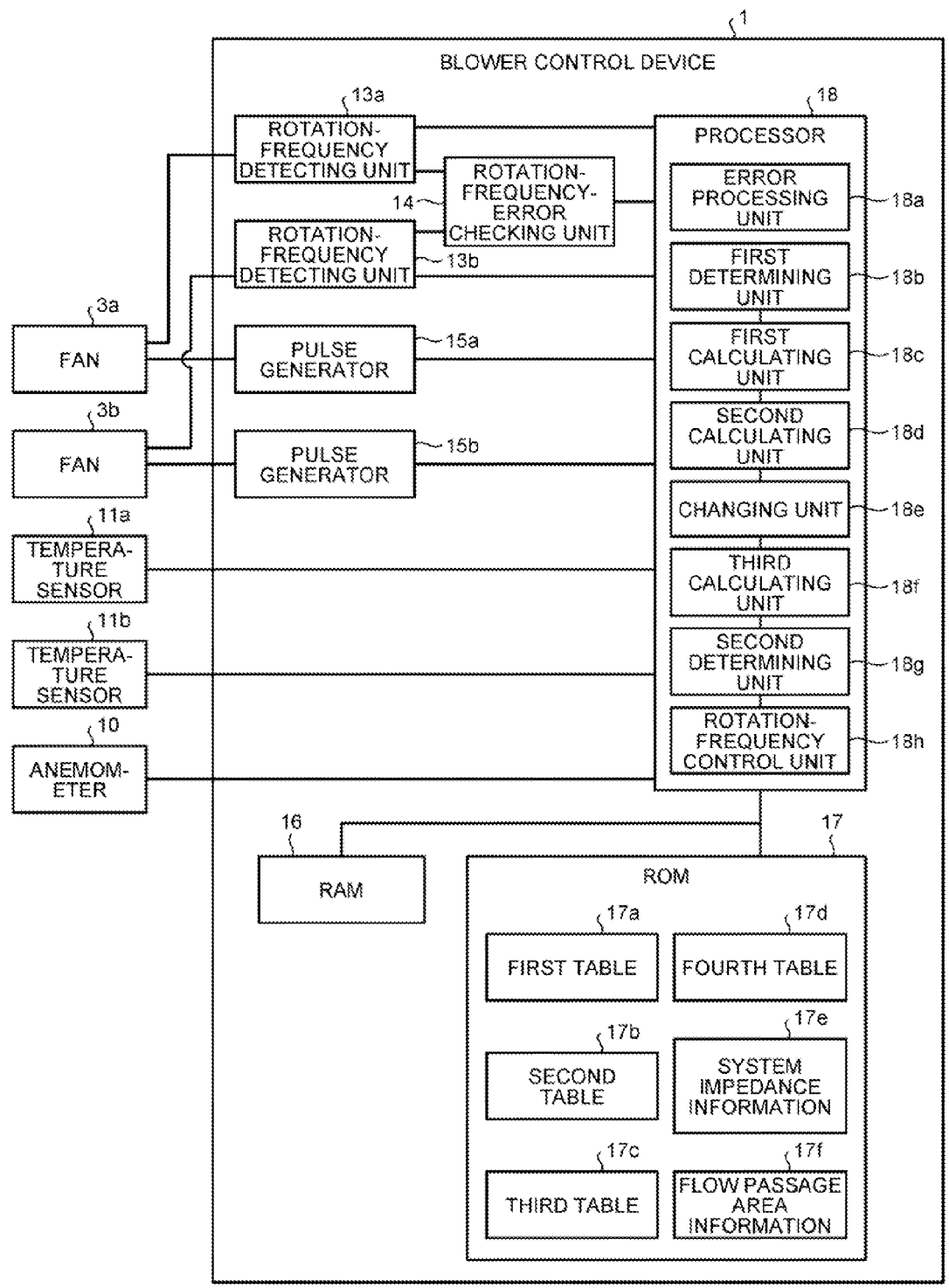
FIG. 2 is a block diagram illustrating an example of a configuration of the blower control device according to the first embodiment.

FIG. 2 is a block diagram illustrating an example of a configuration of the blower control device according to the first embodiment. In the example of FIG. 2, the blower control device 1 includes the anemometer 10, the temperature sensors 11a and 11b, rotation-frequency detecting units 13a and 13b, a rotation-frequency-error checking unit 14, and pulse generators 15a and 15b. Furthermore, the blower control device 1 includes a random access memory (RAM) 16, a read-only memory (ROM) 17, and a processor 18.

The anemometer 10 is placed in a position where the speed of air flow from the counter-rotating fan 3 can be detected, for example, on the downstream side of the counter-rotating fan 3 in the air-flow direction. The anemometer 10 detects the speed of air flow from the counter-rotating fan 3. The temperature sensor 11a is attached to the heat generating body 52. The temperature sensor 11a detects the temperature of the heat generating body 52. The temperature sensor 11b is placed on the side of an air intake of the electronic device 50, and detects the intake-air temperature of the electronic device 50.

The rotation-frequency detecting units 13a and 13b detect rotation frequencies of the fans 3a and 3b, respectively. For example, the rotation-frequency detecting units 13a and 13b are pulse counters.

The rotation-frequency-error checking unit 14 checks whether the fans 3a and 3b are rotating properly on the basis of the rotation frequencies of the fans 3a and 3b detected by the rotation-frequency detecting units 13a and 13b. Then, the rotation-frequency-error checking unit 14 notifies the processor 18 of a check result.

The pulse generators 15a and 15b input pulses for controlling the rotation frequencies of the fans 3a and 3b to the fans 3a and 3b at pulse widths according to instructions from the processor 18, respectively. This pulse width is also referred to as a PWM value. To explain with a concrete example, the pulse generator 15a inputs a pulse of a PWM value indicated by a duty ratio instructed by the processor 18 to the fan 3a. The pulse generator 15b inputs a pulse of a PWM value indicated by a duty ratio instructed by the processor 18 to the fan 3b. Consequently, the fans 3a and 3b rotate at rotation frequencies according to the pulses input from the pulse generators 15a and 15b, respectively.

A ROM 27 stores therein programs that the processor 18 executes and various data used for processes performed by the processor 18. For example, the ROM 27 stores therein a first table 17a, a second table 17b, a third table 17c, a fourth table 17d, system impedance information 17e, and flow passage area information 17f.

In the first table 17a, information on a PQ characteristic of the counter-rotating fan 3 when the counter-rotating fan 3 is put in rated operation, thereby rotating the fans 3a and 3b at respective rotation frequencies at the time of rated operation is registered. In addition, information on a load noise characteristic indicating a relationship between a volume of air flow from the counter-rotating fan 3 and produced load noise when the counter-rotating fan 3 is put in rated operation, thereby rotating the fans 3a and 3b at the respective rotation frequencies for rated operation is also registered in the first table 17a. Such information on a PQ characteristic and a load noise characteristic can be obtained by actual measurement or simulation. Information on a PQ characteristic and a load noise characteristic obtained by actual measurement or simulation is registered in the first table 17a. Incidentally, the information on the PQ characteristic is information including multiple pairs of air flow volumes and static pressures. Furthermore, the information on the load noise characteristic is information including multiple pairs of air flow volumes and load noises.

Figures 3A, 3B:
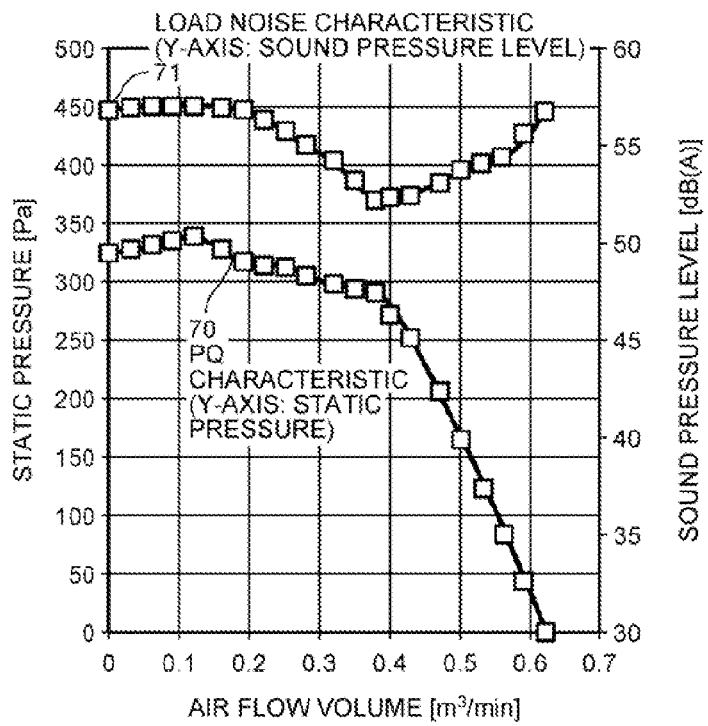
FIG. 3A is a diagram illustrating an example of a first table.
FIG. 3B is a diagram illustrating a PQ characteristic and a load noise characteristic in the example of FIG. 3A.

FIG. 3A is a diagram illustrating an example of the first table. In the example of FIG. 3A, there is provided a case where multiple pairs of air flow volumes Q and static pressures P have been registered in the first table 17a as the information on the PQ characteristic. In FIG. 3A, for example, it is indicated that a static pressure P is 316 [Pa] when the air flow volume Q is 0.19 [m$^3$/min]. Furthermore, in the example of FIG. 3A, there is provided a case where multiple pairs of air flow volumes Q and sound pressure levels L have been registered as the information on the load noise characteristic. In FIG. 3A, for example, it is indicated that a sound pressure level L is 56.8 [dB(A)] when the air flow volume Q is 0.19 [m$^3$/min].

FIG. 3B is a diagram illustrating the PQ characteristic and the load noise characteristic in the example of FIG. 3A. The example of FIG. 3B indicates a PQ characteristic 70 where an air flow volume is plotted on the horizontal axis and a static pressure is plotted on the vertical axis. Furthermore, the example of FIG. 3B indicates a load noise characteristic 71 where an air flow volume is plotted on the horizontal axis and a sound pressure level is plotted on the vertical axis.

In the second table 17b, information on a PQ characteristic of the counter-rotating fan 3 when the fans 3a and 3b rotate at respective rotation frequencies based on each of multiple different ratios of the rotation frequencies of the fans 3a and 3b is registered with respect to each rotation frequency ratio. In addition, information on a load noise characteristic of the counter-rotating fan 3 when the fans 3a and 3b rotate at respective rotation frequencies based on each of the multiple rotation frequency ratios is registered in the second table 17b with respect to each rotation frequency ratio. Such information on a PQ characteristic and a load noise characteristic can be obtained by actual measurement or simulation. Information on a PQ characteristic and a load noise characteristic obtained by actual measurement or simulation is registered in the second table 17b with respect to each ratio of the rotation frequencies of the fans 3a and 3b. Incidentally, the information on the PQ characteristic is information including multiple pairs of air flow volumes and static pressures. Furthermore, the information on the load noise characteristic is information including multiple pairs of air flow volumes and load noises.

Figures 4A, 4B:
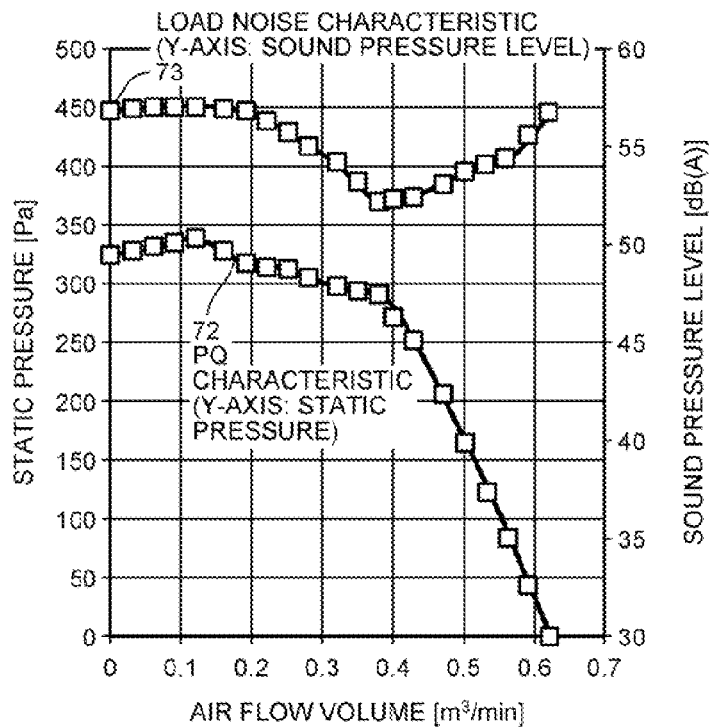
FIG. 4A is a diagram illustrating an example of a second table.
FIG. 4B is a diagram illustrating a PQ characteristic and a load noise characteristic in the example of FIG. 4A.

FIG. 4A is a diagram illustrating an example of the second table. In the example of FIG. 4A, there is provided a case where multiple pairs of air flow volumes Q and static pressures P have been registered in the second table 17b as information on a PQ characteristic when a ratio (Sr/Sf) of a rotation frequency Sr of the fan 3b to a rotation frequency Sf of the fan 3a is, for example, 70%. In FIG. 4A, for example, it is indicated that a static pressure P is 324 [Pa] when the air flow volume Q is 0.19 [m³/min]. Furthermore, in the example of FIG. 4A, there is provided a case where multiple pairs of air flow volumes Q and sound pressure levels L have been registered as information on a load noise characteristic when the rotation frequency ratio is 70%. In FIG. 4A, for example, it is indicated that a sound pressure level L is 57.6 [dB(A)] when the air flow volume Q is 0.19 [m³/min].

FIG. 4B is a diagram illustrating the PQ characteristic and the load noise characteristic in the example of FIG. 4A. The example of FIG. 4B indicates a PQ characteristic 72 where an air flow volume is plotted on the horizontal axis and a static pressure is plotted on the vertical axis. Furthermore, the example of FIG. 4B indicates a load noise characteristic 73 where an air flow volume is plotted on the horizontal axis and a sound pressure level is plotted on the vertical axis.

Figures 5A, 5B:
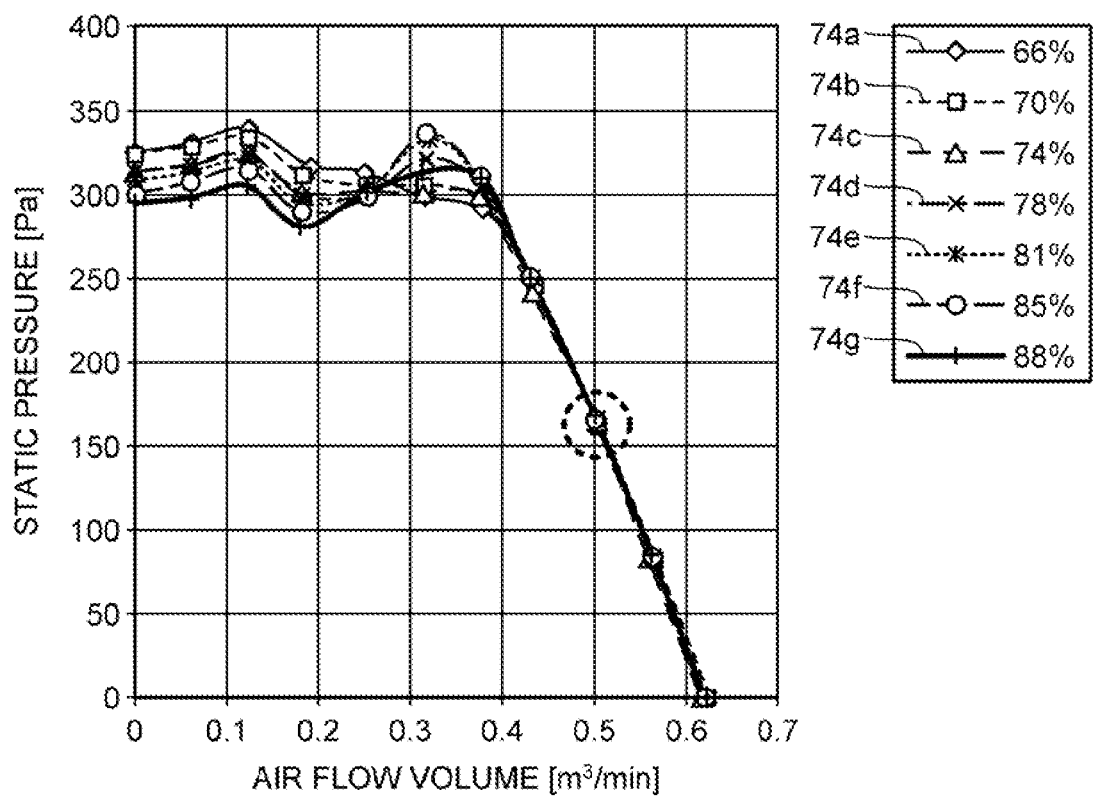
FIG. 5A is a diagram illustrating an example of a characteristic indicated by registered contents of the first table and registered contents of the second table.
FIG. 5B is a diagram illustrating an example of load noise indicated by respective load noise characteristics corresponding to multiple ratios when an air flow volume is 0.5 [m³/min] in the example of FIG. 5A.

FIG. 5A is a diagram illustrating an example of a characteristic indicated by registered contents of the first table and registered contents of the second table. As described above, information on a PQ characteristic and a load noise characteristic is registered in the second table 17b with respect to each rotation frequency ratio. Furthermore, information on a PQ characteristic and a load noise characteristic when the rotation frequency ratio is a rotation frequency ratio for rated operation is registered in the first table 17a. The example of FIG. 5A indicates a PQ characteristic 74a when the rotation frequency ratio is a rotation frequency ratio for rated operation, which is, for example, 66%. Furthermore, the example of FIG. 5A indicates a PQ characteristic 74b of the counter-rotating fan 3 when the rotation frequency ratio is 70%. Moreover, the example of FIG. 5A indicates a PQ characteristic 74c of the counter-rotating fan 3 when the rotation frequency ratio is 74%. Furthermore, the example of FIG. 5A indicates a PQ characteristic 74d of the counter-rotating fan 3 when the rotation frequency ratio is 78%. Moreover, the example of FIG. 5A indicates a PQ characteristic 74e of the counter-rotating fan 3 when the rotation frequency ratio is 81%. Furthermore, the example of FIG. 5A indicates a PQ characteristic 74f of the counter-rotating fan 3 when the rotation frequency ratio is 85%. Moreover, the example of FIG. 5A indicates a PQ characteristic 74g of the counter-rotating fan 3 when the rotation frequency ratio is 88%. As illustrated in the example of FIG. 5A, there are PQ characteristics corresponding to multiple different ratios of the rotation frequency Sr of the fan 3b to the rotation frequency Sf of the fan 3a, respectively. Therefore, a point of intersection between a PQ characteristic and a system impedance curve, i.e., an operating point may or may not be the same among the PQ characteristics.

FIG. 5B is a diagram illustrating an example of load noise indicated by respective load noise characteristics corresponding to multiple rotation frequency ratios when the air flow volume is 0.5 [m³/min] in the example of FIG. 5A. In the example of FIG. 5B, it is indicated that a sound pressure level indicated by a load noise characteristic in the first table 17a is 53.7 [dB(A)] when the rotation frequency ratio is 66% and the air flow volume is 0.5 [m³/min]. Furthermore, in the example of FIG. 5B, it is indicated that a sound pressure level indicated by a corresponding load noise characteristic in the second table 17b is 53.4 [dB(A)] when the rotation frequency ratio is 70% and the air flow volume is 0.5 [m³/min]. Moreover, in the example of FIG. 5B, it is indicated that a sound pressure level indicated by a corresponding load noise characteristic in the second table 17b is 53.4 [dB(A)] when the rotation frequency ratio is 74% and the air flow volume is 0.5 [m³/min]. Furthermore, in the example of FIG. 5B, it is indicated that a sound pressure level indicated by a corresponding load noise characteristic in the second table 17b is 53.8 [dB(A)] when the rotation frequency ratio is 78% and the air flow volume is 0.5 [m³/min]. Moreover, in the example of FIG. 5B, it is indicated that a sound pressure level indicated by a corresponding load noise characteristic in the second table 17b is 53.5 [dB(A)] when the rotation frequency ratio is 81% and the air flow volume is 0.5 [m³/min]. Furthermore, in the example of FIG. 5B, it is indicated that a sound pressure level indicated by a corresponding load noise characteristic in the second table 17b is 53.9 [dB(A)] when the rotation frequency ratio is 85% and the air flow volume is 0.5 [m³/min]. Moreover, in the example of FIG. 5B, it is indicated that a sound pressure level indicated by a corresponding load noise characteristic in the second table 17b is 53.5 [dB(A)] when the rotation frequency ratio is 88% and the air flow volume is 0.5 [m³/min].

Here we assume a case where a point of intersection between each PQ characteristic and the system impedance curve, i.e., an operating point is the same among the PQ characteristics 74a to 74g, an air flow volume indicated by the operating point is 0.5 [m³/min], and a static pressure is 290 [Pa]. In this case, a sound pressure level corresponding to the operating point differs by rotation frequency ratio as described above, and a sound pressure level when the rotation frequency ratio is 70% or 74% is the lowest. Consequently, the blower control device 1 according to the present embodiment controls the rotation frequency ratio of the counter-rotating fan 3 to be 70% or 74% in order to suppress load noise in such a case. For example, when a rotation frequency ratio for rated operation is 66%, the blower control device 1 determines 70%, which is closer to the rotation frequency ratio at the time of rated operation in the two rotation frequency ratios: 70% and 74%, as a rotation frequency ratio of the counter-rotating fan 3.

The third table 17c is a table in which the temperature of the heat generating body, a common rotation frequency, a duty ratio of the fan 3a, and a duty ratio of the fan 3b are registered. The fourth table 17d is a table in which the intake-air temperature, the common rotation frequency, the duty ratio of the fan 3a, and the duty ratio of the fan 3b are registered. For example, the third table 17c and the fourth table 17d can be created by using a publicly-known technique as described in the literature such as Japanese Laid-open Patent Publication No. 2010-272704. Incidentally, a PWM value can be identified by the duty ratio.

The system impedance information 17e is information on a system impedance of the electronic device 50. The system impedance here is a pressure loss determined from a density rate of each component composing the electronic device 50, the shape of the ventilation flue, and the like.

The flow passage area information 17f indicates an area M of a flow passage of air flow from the counter-rotating fan 3. The flow passage area information 17f is used in, for example, calculation of an air flow volume.

The processor 18 controls respective rotation frequencies of the fans 3a and 3b on the basis of temperatures detected by the temperature sensors 11a and 11b so as to obtain a sufficient volume of air flow for cooling the heat generating body 52 in a state where a ratio of the rotation frequencies of the fans 3a and 3b is within the predetermined allowable range.

As illustrated in FIG. 2, the processor 18 includes an error processing unit 18a, a first determining unit 18b, a first calculating unit 18c, a second calculating unit 18d, a changing unit 18e, a third calculating unit 18f, a second determining unit 18g, and a rotation-frequency control unit 18h.

The error processing unit 18a performs an error reporting process on the basis of information obtained from the rotation-frequency-error checking unit 14. When obtained a check result indicating that the fan 3a or the fan 3b has stopped from the rotation-frequency-error checking unit 14, the error processing unit 18a gives the electronic device 50 an error report on the fan 3a or the fan 3b having stopped. Accordingly, for example, an error message that the fan 3a or the fan 3b has stopped is displayed on a display (not illustrated) of the electronic device 50.

The first determining unit 18b determines an operating point ($Q_0$, $P_0$) on the basis of a PQ characteristic corresponding to a rotation frequency ratio for rated operation when the fans 3a and 3b rotate at respective rotation frequencies for rated operation. Here, an air flow volume $Q_0$ indicated by the operating point is a volume of air flow through the ventilation flue 51 when the fans 3a and 3b rotate at the respective rotation frequencies for rated operation. Furthermore, a static pressure $P_0$ indicated by the operating point is a static pressure of the counter-rotating fan 3 when the fans 3a and 3b rotate at the respective rotation frequencies for rated operation.

To explain with a concrete example, the first determining unit 18b first initiates the input of respective duty ratios indicating rotation frequencies for rated operation to the fans 3a and 3b so that the fans 3a and 3b rotate at the respective rotation frequencies for rated operation. Accordingly, the counter-rotating fan 3 begins the rated operation. Then, the first determining unit 18b acquires an air-flow speed $S_0$ from the anemometer 10. And then, the first determining unit 18b reads flow passage area information 17f from the ROM 17, and calculates the product (M×$S_0$) of a flow passage area M indicated by the flow passage area information 17f and the air-flow speed $S_0$ as an air flow volume $Q_0$.

Then, the first determining unit 18b reads information on a PQ characteristic of the counter-rotating fan 3 in rated operation from the first table 17a. Then, the first determining unit 18b determines whether there is any pair including the air flow volume $Q_0$ in multiple pairs of air flow volumes and static pressures included in the read information on the PQ characteristic. When there is a pair including the air flow volume $Q_0$, the first determining unit 18b determines the pair ($Q_0$, $P_0$) including the air flow volume $Q_0$ as an operating point.

On the other hand, when there is no pair including the air flow volume $Q_0$, the first determining unit 18b extracts a pair ($Q_0'$, $P_0'$) including an air flow volume $Q_0'$ higher than the air flow volume $Q_0$ and a pair ($Q_0''$, $P_0''$) including an air flow volume $Q_0''$ lower than the air flow volume $Q_0$. Then, the first determining unit 18b performs linear interpolation between $P_0'$ and $P_0''$ using the pair ($Q_0'$, $P_0'$) and the pair ($Q_0''$, $P_0''$), and calculates a static pressure $P_0$ corresponding to the air flow volume $Q_0$. For example, the first determining unit 18b calculates $P_0$ using the following equation (1).

$$P_0 = P_0'' + (P_0' - P_0'') \times ((Q_0 - Q_0'')/(Q_0' - Q_0'')) \quad (1)$$

After that, the first determining unit 18b determines ($Q_0$, $P_0$) as an operating point. In this way, the first determining unit 18b determines a point of intersection between the PQ characteristic of the counter-rotating fan 3 in rated operation and the system impedance curve, i.e., the operating point ($Q_0$, $P_0$).

The first calculating unit 18c calculates a sound pressure level $L_0$ corresponding to the air flow volume $Q_0$ indicated by the operating point determined by the first determining unit 18b on the basis of a load noise characteristic in rated operation. For example, the first calculating unit 18c reads information on a load noise characteristic in rated operation from the first table 17a. Then, the first calculating unit 18c calculates a sound pressure level $L_0$ corresponding to an air flow volume $Q_0$ from the read load noise characteristic. In the example of FIG. 3A, the first calculating unit 18c calculates a corresponding sound pressure level of 52.4 [dB(A)] when an air flow volume $Q_0$ indicated by the operating point ($Q_0$, $P_0$) is 0.43 [m³/min].

The second calculating unit 18d performs the following process on the basis of multiple PQ characteristics registered in the second table 17b, a relationship between air flow volume and static pressure which indicates a system impedance, and the operating point ($Q_0$, $P_0$). Namely, the second calculating unit 18d calculates an air flow volume $Q_N$ of air flow through the ventilation flue 51 and a static pressure $P_N$ when the fans 3a and 3b are rotating with respect to each of multiple rotation frequency ratios. Incidentally, N is a value for identifying any of the multiple rotation frequency ratios. For example, when the number of rotation frequency ratios is 10, a value of N is any of ten integers from 1 to 10.

To explain with a concrete example, the second calculating unit 18d first reads information on all PQ characteristics and load noise characteristics registered in the second table 17b with respect to each rotation frequency ratio. Then, the second calculating unit 18d selects information on a PQ characteristic and information on a load noise characteristic which correspond to a ratio which has not yet been selected out of all rotation frequency ratios. Then, the second calculating unit 18d first calculates an air flow volume $Q_N$ at an operating point ($Q_N$, $P_N$) on the selected PQ characteristic from the selected information on the PQ characteristic.

Figure 6:
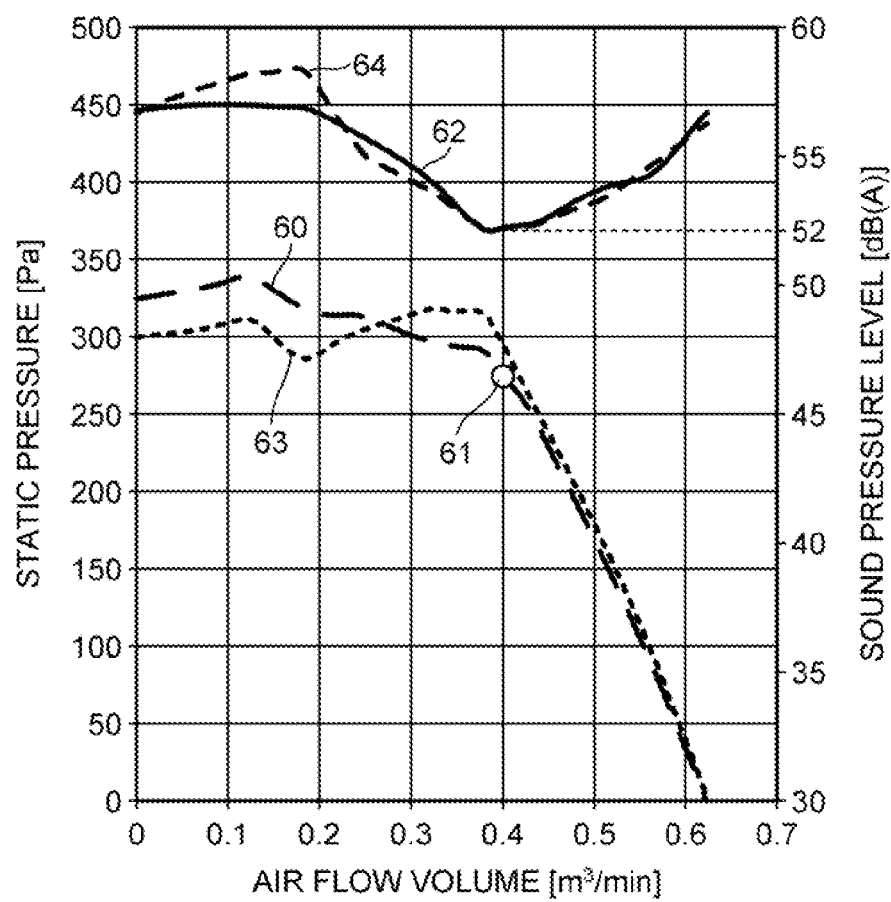
FIG. 6 is a diagram for explaining an example of a process performed by the blower control device.
Figure 7:
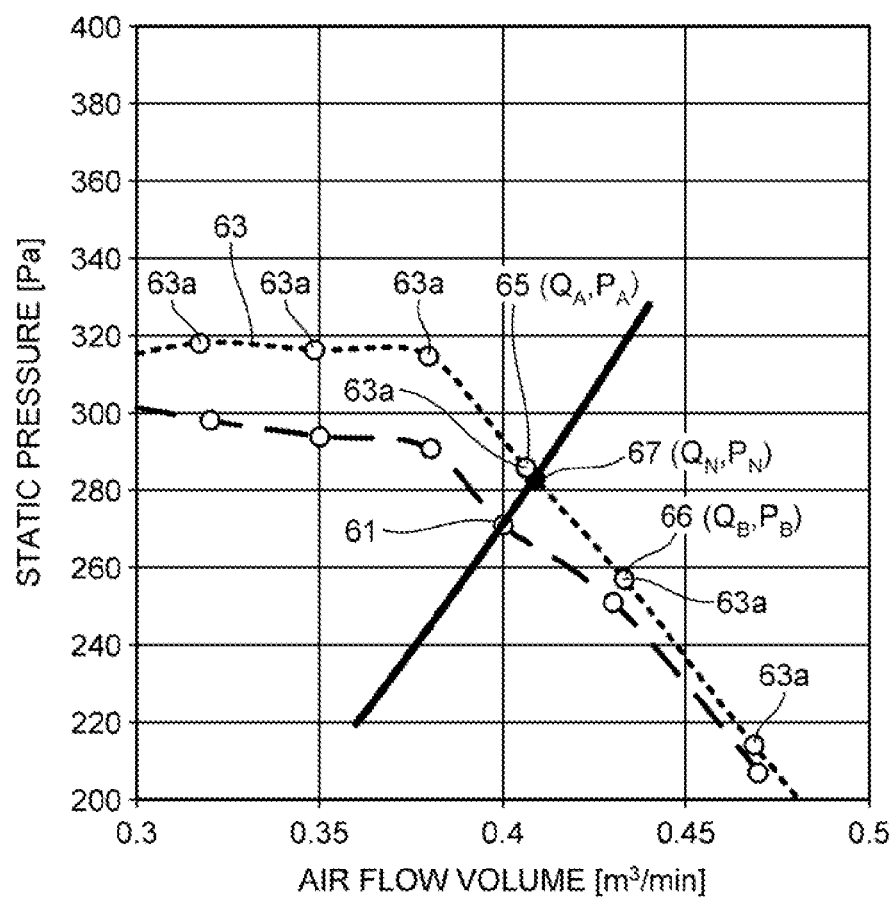
FIG. 7 is a detail drawing of a portion around an operating point illustrated in FIG. 6.

An example of how to calculate the air flow volume $Q_N$ is explained. FIG. 6 is a diagram for explaining an example of a process performed by the blower control device. In the example of FIG. 6, there is provided a case where an operating point ($Q_0$, $P_0$) 61 on a PQ characteristic 60 in rated operation has been determined by the first determining unit 18b. Furthermore, in the example of FIG. 6, there is provided a case where 52 [dB(A)] has been calculated from a load noise characteristic 62 as a sound pressure level corresponding to the operating point ($Q_0$, $P_0$) 61 by the first calculating unit 18c. The example of FIG. 6 illustrates a case where the second calculating unit 18d selects information on a PQ characteristic 63 and information on a load noise characteristic 64 which correspond to a rotation frequency ratio which has not yet been selected, for example, a rotation frequency ratio of 70%. FIG. 7 is a detail drawing of a portion around the operating point illustrated in FIG. 6. In the example of FIG. 7, a system impedance is expressed by an equation of static pressure P=coefficient k×(air flow volume Q)²; therefore, a relationship between an intersection point ($Q_N$, $P_N$) 67 between a system impedance curve and the PQ characteristic 63 and the operating point ($Q_0$, $P_0$) 61 is expressed by the following equation (2).

$$P_N/(Q_N)^2 = P_0/(Q_0)^2 \quad (2)$$

Furthermore, the coefficient k of the system impedance is determined in advance. Therefore, the second calculating unit 18d can identify two pairs 63a forming a line segment having the intersection point ($Q_N$, $P_N$) 67 out of pairs 63a of the PQ characteristic 63 as a point ($Q_A$, $P_A$) 65 and a point ($Q_B$, $P_B$) 66. Here, the intersection point ($Q_N$, $P_N$) 67 is located between the point ($Q_A$, $P_A$) 65 and the point ($Q_B$, $P_B$) 66, so the following equation (3) is proven true.

$$(P_A - P_N)/(Q_A - Q_N) = (P_B - P_N)/(Q_B - Q_N) \quad (3)$$

The second calculating unit 18d eliminates $P_N$ from the above equations (2) and (3), and calculates $Q_N$ using the following equation (4).

$$Q_N = (\alpha^2/4 + \beta)^{1/2} - (\alpha/2) \quad (4)$$

Provided that $\alpha = Q_0^2 (P_A - P_B)/P_0/(Q_B - Q_A)$, $\beta = Q_0^2 (P_A Q_B - P_B Q_A)/P_0/(Q_B - Q_A)$ Then, the second calculating unit 18d substitutes a value of the calculated air flow volume $Q_N$ into the above equation (2), thereby calculating a static pressure $P_N$.

In this manner, the second calculating unit 18d can calculate an operating point ($Q_N$, $P_N$) on a selected PQ characteristic from selected information on the PQ characteristic. The second calculating unit 18d performs the same process on all information on PQ characteristics registered in the second table 17b and calculates respective operating points ($Q_N$, $P_N$) on the PQ characteristics. Namely, the second calculating unit 18d can calculate a point of intersection between a PQ characteristic of the counter-rotating fan 3 with respect to each rotation frequency ratio and the system impedance curve, i.e., an operating point ($Q_N$, $P_N$) in the manner described above.

Figure 8:
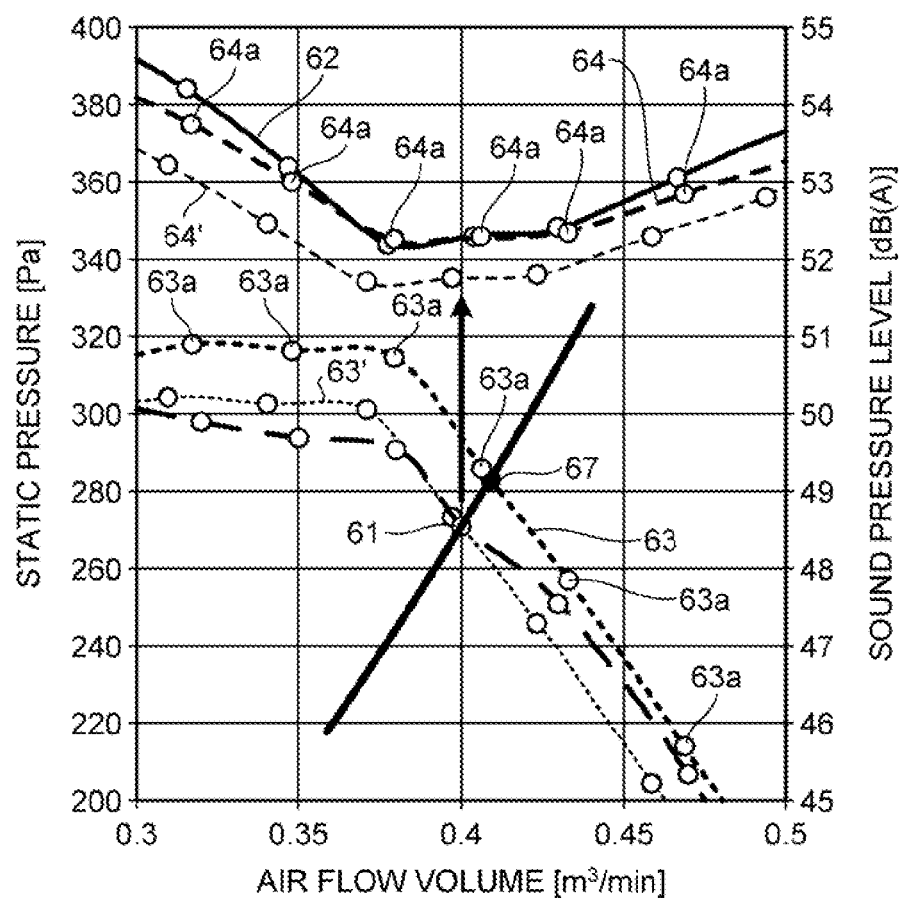
FIG. 8 is a diagram for explaining an example of a process performed by the blower control device.

The changing unit 18e changes respective load noise characteristics of multiple rotation frequency ratios with respect to each rotation frequency ratio on the basis of an air flow volume $Q_0$ and an air flow volume $Q_N$ with respect to each rotation frequency ratio. To explain with a concrete example, when an operating point ($Q_N$, $P_N$) on a PQ characteristic has been calculated by the second calculating unit 18d, the changing unit 18e multiplies an air flow volume Q of each pair on the selected PQ characteristic by $(Q_0/Q_N)$, and multiplies a static pressure P of the pair by $(Q_0/Q_N)^2$, thereby changing the PQ characteristic. FIG. 8 is a diagram for explaining an example of a process performed by the blower control device. In the example of FIG. 8, when the operating point ($Q_N$, $P_N$) 67 on the PQ characteristic 63 has been calculated by the second calculating unit 18d, the changing unit 18e multiplies an air flow volume Q of each pair 63a on the selected PQ characteristic 63 by $(Q_0/Q_N)$, and multiplies a static pressure P of the pair 63a by $(Q_0/Q_N)^2$, thereby scaling the PQ characteristic. In the example of FIG. 8, the changing unit 18e changes the PQ characteristic 63 into a PQ characteristic 63' in this way. At this time, the PQ characteristic 63' passes through the operating point ($Q_0$, $P_0$) 61. Namely, the changing unit 18e changes the selected PQ characteristic so as to pass through the operating point ($Q_0$, $P_0$) determined by the first determining unit 18b.

Furthermore, when the operating point ($Q_N$, $P_N$) on the PQ characteristic has been calculated by the second calculating unit 18d, the changing unit 18e adds $10 \times \log(Q_0/Q_N)^m$ to a sound pressure level L of each pair on a selected load noise characteristic, and multiplies an air flow volume Q of the pair by $(Q_0/Q_N)$, thereby changing the load noise characteristic. In the example of FIG. 8, when the operating point ($Q_N$, $P_N$) 67 on the PQ characteristic 63 has been calculated by the second calculating unit 18d, the changing unit 18e performs the following process. That is, the changing unit 18e multiplies an air flow volume Q of each pair 64a on the selected load noise characteristic 64 by $(Q_0/Q_N)$, and adds $10 \times \log(Q_0/Q_N)^m$ to a sound pressure level L of the pair 64a, thereby scaling the load noise characteristic 64. In the example of FIG. 8, the changing unit 18e changes the load noise characteristic 64 into a load noise characteristic 64' in this way. The changing unit 18e performs this process with respect to each of all rotation frequency ratios.

Figure 9A:
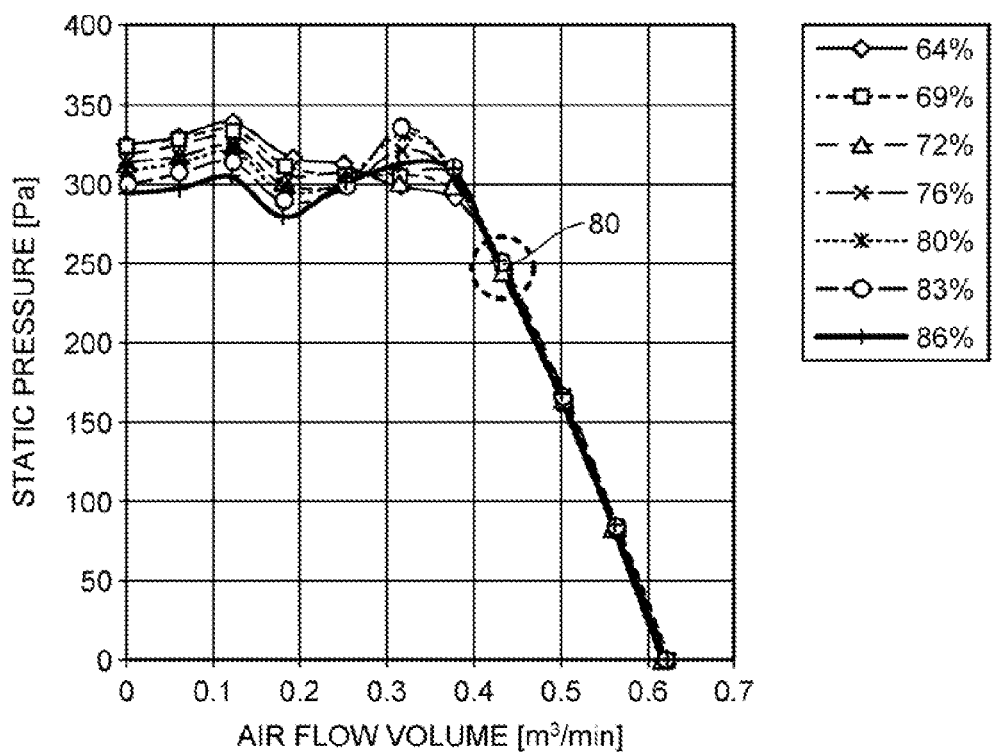
FIG. 9A is a diagram illustrating an example of a process performed by the blower control device.
Figure 9B:
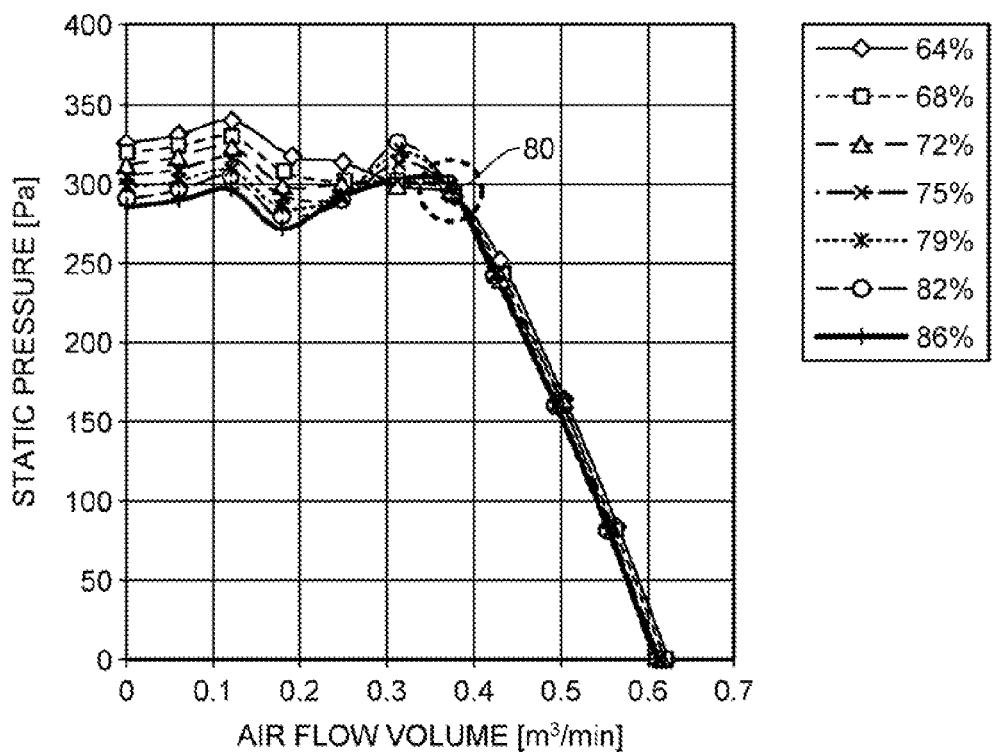
FIG. 9B is a diagram illustrating another example of the process performed by the blower control device.

FIGS. 9A, 9B, and 9C are diagrams illustrating examples of a process performed by the blower control device. In the respective examples of FIGS. 9A, 9B, and 9C, there is provided a case where multiple PQ characteristics have been changed so as to pass through an operating point ($Q_0$, $P_0$) 80 by the changing unit 18e.

The third calculating unit 18f calculates a noise level corresponding to an air flow volume $Q_0$ with respect to each of multiple rotation frequency ratios on the basis of a load noise characteristic changed by the changing unit 18e. For example, the third calculating unit 18f determines whether there is any pair including the air flow volume $Q_0$ in multiple pairs included in information on the changed load noise characteristic. When there is a pair including the air flow volume $Q_0$, the third calculating unit 18f calculates a sound pressure level $L_N$ indicated by the pair ($Q_0$, $L_N$) including the air flow volume $Q_0$ as a noise level.

On the other hand, when there is no pair including the air flow volume $Q_0$, the third calculating unit 18f extracts a pair ($Q_0'$, L') including an air flow volume $Q_0'$ higher than the air flow volume $Q_0$ and a pair ($Q_0''$, L") including an air flow volume $Q_0''$ lower than the air flow volume $Q_0$ from information on the changed load noise characteristic. Then, the third calculating unit 18f performs linear interpolation between L' and L" using the pair ($Q_0'$, L') and the pair ($Q_0''$, L"), and calculates a sound pressure level $L_N$ corresponding to the air flow volume $Q_0$. For example, the third calculating unit 18f calculates the sound pressure level $L_N$ as a noise level using the following equation (5).

$$L_N = L'' + (L' - L'') \times ((Q_0 - Q_0'')/(Q_0' - Q_0'')) \quad (5)$$

Then, the third calculating unit 18f stores the calculated sound pressure level $L_N$ and the rotation frequency ratio in the RAM 16 in a corresponding manner. FIGS. 10A, 10B, and 10C are diagrams illustrating examples of correspondence between a calculated sound pressure level and a rotation frequency ratio. For example, the example of FIG. 10A illustrates correspondence between calculated sound pressure levels $L_N$ and respective rotation frequency ratios in the example of FIG. 9A. The example of FIG. 10B illustrates correspondence between calculated sound pressure levels $L_N$ and respective rotation frequency ratios in the example of FIG. 9B. The example of FIG. 10C illustrates correspondence between calculated sound pressure levels $L_N$ and respective rotation frequency ratios in the example of FIG. 9C.

The second determining unit 18g determines a rotation frequency ratio corresponding to the lowest noise level out of a sound pressure level $L_0$ calculated by the first calculating unit 18c and multiple sound pressure levels $L_N$ calculated by the third calculating unit 18f as a rotation frequency ratio $C_0$ at which the fans 3a and 3b are rotated. To explain with a concrete example, the second determining unit 18g detects a rotation frequency ratio corresponding to the lowest noise level on the basis of pairs of sound pressure levels $L_N$ and rotation frequency ratios stored in the RAM 16. When the number of detected rotation frequency ratios is one, the second determining unit 18g determines the detected rotation frequency ratio as the rotation frequency ratio $C_0$ at which the fans 3a and 3b are rotated. When the number of detected rotation frequency ratios is more than one, the second determining unit 18g determines a rotation frequency ratio closest to a rotation frequency ratio at the time of rated operation in the detected rotation frequency ratios as the rotation frequency ratio $C_0$ at which the fans 3a and 3b are rotated.

For example, in the example of FIG. 10A, when the rotation frequency ratio at the time of rated operation is 64% and the sound pressure level $L_0$ is 52.4 [dB(A)], the second determining unit 18g performs the following process. That is, the second determining unit 18g determines 69% corresponding to the lowest sound pressure level 52.4 [dB(A)] out of the sound pressure level $L_0$ and the multiple sound pressure levels $L_N$ as the rotation frequency ratio $C_0$ at which the fans 3a and 3b are rotated. Furthermore, in the example of FIG. 10B, when the ratio at the time of rated operation is 64% and the sound pressure level $L_0$ is 52.2 [dB(A)], the second determining unit 18g performs the following process. That is, the second determining unit 18g determines 79% corresponding to the lowest sound pressure level 51.8 [dB(A)] out of the sound pressure level $L_0$ and the multiple sound pressure levels $L_N$ as the rotation frequency ratio $C_0$ at which the fans 3a and 3b are rotated. Moreover, in the example of FIG. 10C, when the ratio at the time of rated operation is 63% and the sound pressure level $L_0$ is 54.2 [dB(A)], the second determining unit 18g performs the following process. That is, the second determining unit 18g detects rotation frequency ratios of 79% and 82% corresponding to the lowest sound pressure level 52.4 [dB(A)] out of the sound pressure level $L_0$ and the multiple sound pressure levels $L_N$. Then, the second determining unit 18g determines 79%, which is closer to the rotation frequency ratio of 63% at the time of rated operation in the detected two rotation frequency ratios: 79% and 82%, as the rotation frequency ratio $C_0$ at which the fans 3a and 3b are rotated.

The rotation-frequency control unit 18h controls respective rotation frequencies of the fans 3a and 3b so that the inside of the electronic device 50 reaches a predetermined temperature on the basis of temperatures detected by the temperature sensors 11a and 11b. At this time, the rotation-frequency control unit 18h controls the respective rotation frequencies of the fans 3a and 3b so that the fans 3a and 3b rotate at a ratio within a predetermined allowable range with respect to the rotation frequency ratio $C_0$ (a range from $(C_0-\gamma)$ to $(C_0+\gamma)$).

To explain with a concrete example, the rotation-frequency control unit 18h first detects a temperature $T_1$ of the heat generating body 52 and an intake-air temperature $T_2$ from the temperature sensors 11a and 11b. Then, the rotation-frequency control unit 18h reads the third table 17c and acquires a common rotation frequency N1 corresponding to the temperature $T_1$ of the heat generating body 52. Furthermore, the rotation-frequency control unit 18h reads the fourth table 17d and acquires a common rotation frequency N2 corresponding to the intake-air temperature $T_2$. The rotation-frequency control unit 18h compares the common rotation frequency N1 and the common rotation frequency N2. When the common rotation frequency N2 is greater than the common rotation frequency N1, the rotation-frequency control unit 18h reads the fourth table 17d and acquires respective duty ratios of the fans 3a and 3b corresponding to the intake-air temperature $T_2$. On the other hand, when the common rotation frequency N1 is equal to or greater than the common rotation frequency N2, the rotation-frequency control unit 18h reads the third table 17c and acquires respective duty ratios of the fans 3a and 3b corresponding to the temperature $T_1$ of the heat generating body 52. In this manner, by acquiring the respective duty ratios of the fans 3a and 3b, the rotation-frequency control unit 18h determines respective PWM duty ratios of the fans 3a and 3b. Then, the rotation-frequency control unit 18h changes duty ratios to be input to the pulse generators 15a and 15b into the determined duty ratio of the fan 3a and the determined duty ratio of the fan 3b, respectively.

Then, the rotation-frequency control unit 18h determines whether any of the temperature $T_1$ of the heat generating body 52 and the intake-air temperature $T_2$ exceeds respective preset temperatures $T_{01}$ and $T_{02}$. The preset temperature $T_{01}$ here is a temperature set with respect to the temperature of the heat generating body 52, and the preset temperature $T_{02}$ is a temperature set with respect to the intake-air temperature. When the temperature $T_1$ of the heat generating body 52 exceeds the preset temperature $T_{01}$, or when the intake-air temperature $T_2$ exceeds the preset temperature $T_{02}$, the rotation-frequency control unit 18h changes each of duty ratios to be input to the pulse generators 15a and 15b so that a PWM value indicated by the duty ratio is increased by a predetermined amount. Consequently, a volume of air flow generated by the counter-rotating fan 3 is increased. As a result, the temperature of the heat generating body 52 is decreased and comes close to the preset temperature $T_{01}$.

Furthermore, the rotation-frequency control unit 18h determines whether both of the temperature $T_1$ of the heat generating body 52 and the intake-air temperature $T_2$ are lower than the respective preset temperatures $T_{01}$ and $T_{02}$. When the temperature $T_1$ of the heat generating body 52 is lower than the preset temperature $T_{01}$ and also the intake-air temperature $T_2$ is lower than the preset temperature $T_{02}$, the rotation-frequency control unit 18h changes each of duty ratios to be input to the pulse generators 15a and 15b so that a PWM value indicated by the duty ratio is decreased by a predetermined amount. Consequently, a volume of air flow generated by the counter-rotating fan 3 is reduced. As a result, the temperature of the heat generating body 52 is increased and comes close to the preset temperature $T_{01}$.

Then, the rotation-frequency control unit 18h acquires a rotation frequency Sf of the fan 3a detected by the rotation-frequency detecting unit 13a, thereby detecting the rotation frequency Sf of the fan 3a. Furthermore, the rotation-frequency control unit 18h acquires a rotation frequency Sr of the fan 3b detected by the rotation-frequency detecting unit 13b, thereby detecting the rotation frequency Sr of the fan 3b. Then, the rotation-frequency control unit 18h calculates a rotation frequency ratio C (Sr/Sf). Then, the rotation-frequency control unit 18h determines whether the ratio C is within a predetermined allowable range with respect to the rotation frequency ratio $C_0$ (a range from $(C_0-\gamma)$ to $(C_0+\gamma)$). When the ratio C is not within the allowable range, the rotation-frequency control unit 18h changes a duty ratio to be input to the pulse generator 15a so that the ratio C is within the allowable range. For example, when the ratio C is lower than $(C_0-\gamma)$, the rotation-frequency control unit 18h changes a duty ratio to be input to the pulse generator 15a so that a PWM value indicated by the duty ratio is decreased by a predetermined amount. As a result, a value of the ratio C is increased. On the other hand, when the ratio C is higher than $(C_0-\gamma)$, the rotation-frequency control unit 18h changes a duty ratio to be input to the pulse generator 15a so that a PWM value indicated by the duty ratio is increased by a predetermined amount. As a result, a value of the ratio C is decreased.

Figure 11:
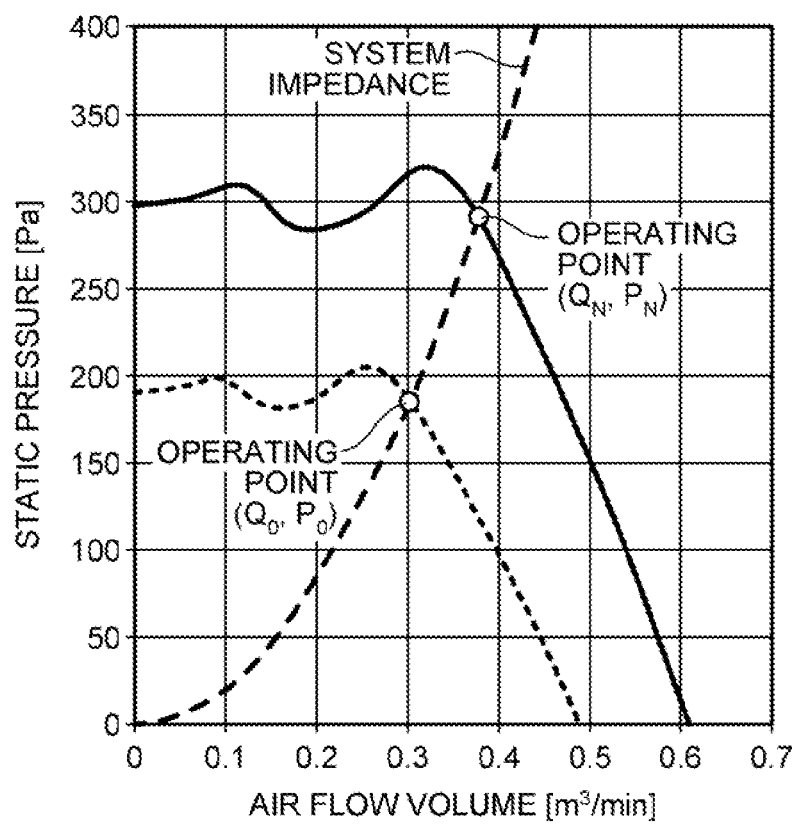
FIG. 11 is a diagram for explaining an example of a process performed by the blower control device according to the first embodiment.

FIG. 11 is a diagram for explaining an example of a process performed by the blower control device according to the first embodiment. As illustrated in the example of FIG. 11, the blower control device 1 changes a PQ characteristic registered in the second table 17b so that an operating point ($Q_N$, $P_N$) on the PQ characteristic registered in the second table 17b agrees with an operating point ($Q_0$, $P_0$) on a PQ characteristic registered in the first table 17a. At this time, the blower control device 1 changes the PQ characteristic registered in the second table 17b at a rate based on $Q_N$ and $Q_0$. Furthermore, the blower control device 1 changes a load noise characteristic registered in the second table 17b at a rate based on $Q_N$ and $Q_0$. Then, the blower control device 1 calculates load noise corresponding to the operating point ($Q_0$, $P_0$) with respect to each rotation frequency ratio from the changed load noise characteristic. Then, the blower control device 1 determines a rotation frequency ratio corresponding to the lowest load noise as a rotation frequency ratio at which the fans 3a and 3b are rotated. In this manner, the blower control device 1 according to the first embodiment selects a rotation frequency ratio resulting in the minimum load noise taking into consideration the system impedance of the electronic device 50, a PQ characteristic of the counter-rotating fan 3 with respect to each ratio of the rotation frequencies of the fans 3a and 3b, and a load noise characteristic with respect to each rotation frequency ratio. Consequently, the blower control device 1 according to the first embodiment can further suppress noise.

[Flow of Process]

Figure 12:
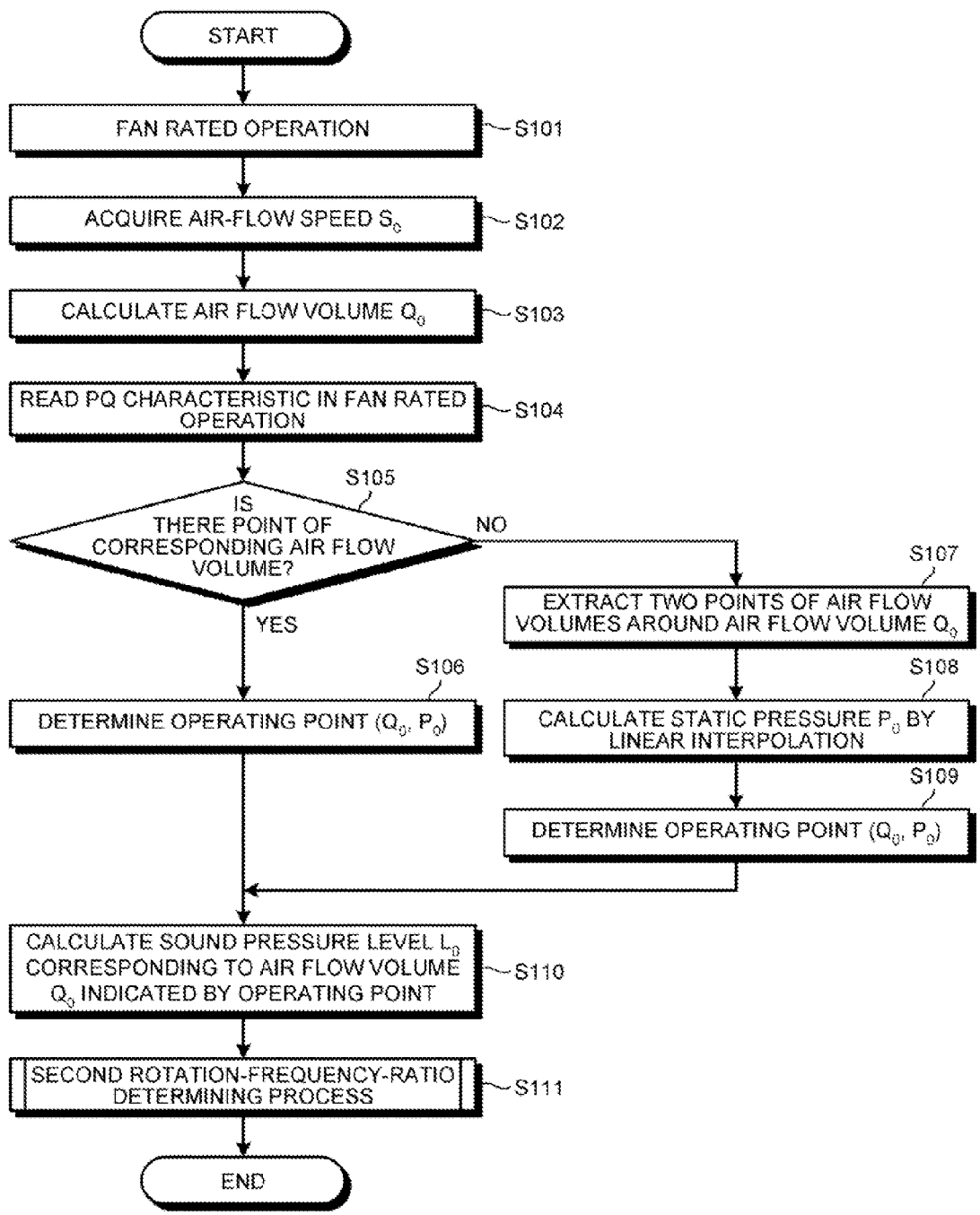
FIG. 12 is a flowchart illustrating procedures of a first rotation-frequency-ratio determining process according to the first embodiment.

Subsequently, a flow of the process performed by the blower control device 1 according to the present embodiment is explained. FIG. 12 is a flowchart illustrating procedures of a first rotation-frequency-ratio determining process according to the first embodiment. There are various possible cases of the timing to perform the first rotation-frequency-ratio determining process. For example, the first rotation-frequency-ratio determining process is performed when the processor 18 has received an instruction to perform the first rotation-frequency-ratio determining process from an accepting unit (not illustrated) that accepts a user's instruction, such as a keyboard or a mouse.

As illustrated in FIG. 12, the first determining unit 18b initiates the input of respective duty ratios indicating rotation frequencies for rated operation to the fans 3a and 3b so that the fans 3a and 3b rotate at the respective rotation frequencies for rated operation (S101). Then, the first determining unit 18b acquires an air-flow speed $S_0$ from the anemometer 10 (S102). And then, the first determining unit 18b reads flow passage area information 17f from the ROM 17, and calculates the product (M×$S_0$) of a flow passage area M indicated by the flow passage area information 17f and the air-flow speed $S_0$ as an air flow volume $Q_0$ (S103).

Then, the first determining unit 18b reads information on a PQ characteristic of the counter-rotating fan 3 in rated operation from the first table 17a (S104). Then, the first determining unit 18b determines whether there is any pair including the air flow volume $Q_0$ in multiple pairs of air flow volumes and static pressures included in the read information on the PQ characteristic (S105). When there is a pair including the air flow volume $Q_0$ (YES at S105), the first determining unit 18b determines the pair ($Q_0$, $P_0$) including the air flow volume $Q_0$ as an operating point (S106).

On the other hand, when there is no pair including the air flow volume $Q_0$ (NO at S105), the first determining unit 18b extracts a pair ($Q_0'$, $P_0'$) including an air flow volume $Q_0'$ higher than the air flow volume $Q_0$ and a pair ($Q_0''$, $P_0''$) including an air flow volume $Q_0''$ lower than the air flow volume $Q_0$ (S107). Then, the first determining unit 18b performs linear interpolation between $P_0'$ and $P_0''$ using the pair ($Q_0'$, $P_0'$) and the pair ($Q_0''$, $P_0''$), and calculates a static pressure $P_0$ corresponding to the air flow volume $Q_0$ (S108). After that, the first determining unit 18b determines ($Q_0$, $P_0$) as an operating point (S109).

Then, the first calculating unit 18c reads information on a load noise characteristic in rated operation from the first table 17a, and calculates a sound pressure level $L_0$ corresponding to the air flow volume $Q_0$ from the read load noise characteristic (S110). Then, the processor 18 performs a second rotation-frequency-ratio determining process to be described below (S111), and the process ends.

Figure 13:
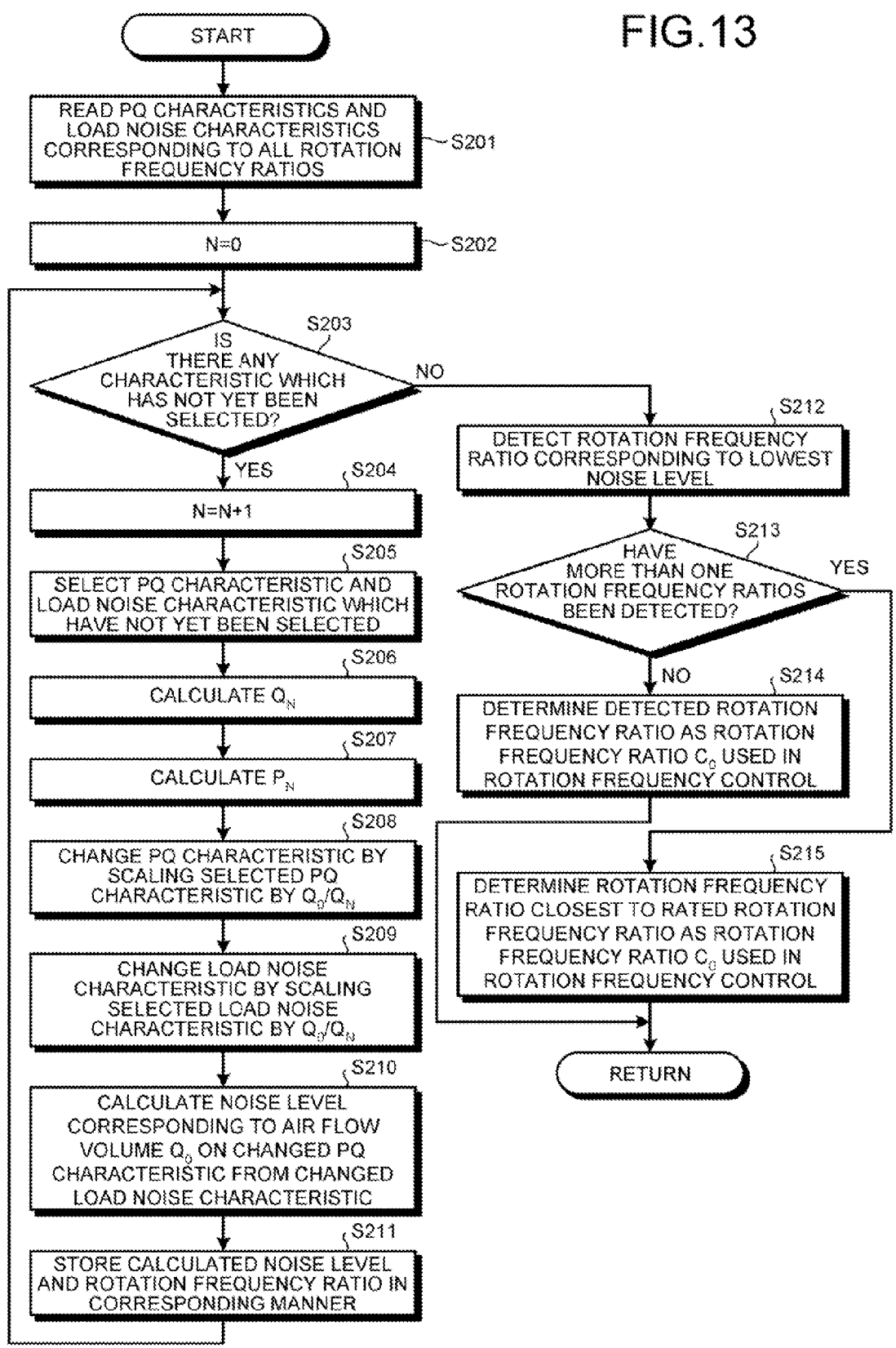
FIG. 13 is a flowchart illustrating procedures of a second rotation-frequency-ratio determining process according to the first embodiment.

FIG. 13 is a flowchart illustrating procedures of the second rotation-frequency-ratio determining process according to the first embodiment. As illustrated in FIG. 13, the second calculating unit 18d reads information on all PQ characteristics and load noise characteristics registered in the second table 17b with respect to each ratio (S201). Then, the second calculating unit 18d puts zero into a value of variable N (S202). Then, the second calculating unit 18d determines whether there is any information on a PQ characteristic and information on a load noise characteristic which correspond to a ratio which has not yet been selected at S205 to be described below out of all rotation frequency ratios (S203). When there is information which has not yet been selected (YES at S203), the second calculating unit 18d increments the value of variable N by one (S204). Then, the second calculating unit 18d selects one information on a PQ characteristic and one information on a load noise characteristic which correspond to the ratio which has not yet been selected in all the ratios (S205). Then, the second calculating unit 18d calculates an air flow volume $Q_N$ at an operating point ($Q_N$, $P_N$) on the selected PQ characteristic from the selected information on the PQ characteristic (S206). Then, the second calculating unit 18d calculates a static pressure $P_N$ (S207).

Then, the changing unit 18e multiplies an air flow volume Q of each pair on the selected PQ characteristic by ($Q_0/Q_N$), and multiplies a static pressure P of the pair by ($Q_0/Q_N$)$^2$, thereby changing the PQ characteristic (S208). Then, the changing unit 18e adds 10×log($Q_0/Q_N$)$^m$ to a sound pressure level L of each pair on the selected load noise characteristic, and multiplies an air flow volume Q of the pair by ($Q_0/Q_N$), thereby changing the load noise characteristic (S209). Then, the third calculating unit 18f calculates a sound pressure level $L_N$ as a noise level from the changed load noise characteristic (S210). After that, the third calculating unit 18f stores the calculated sound pressure level $L_N$ and the rotation frequency ratio in the RAM 16 in a corresponding manner (S211), and the process returns to S203.

On the other hand, when there no information which has not yet been selected (NO at S203), the second determining unit 18g detects a rotation frequency ratio corresponding to the lowest noise level on the basis of pairs of sound pressure levels $L_N$ and rotation frequency ratios stored in the RAM 16 (S212). Then, the second determining unit 18g determines whether the number of detected rotation frequency ratios is more than one (S213). When the number of detected rotation frequency ratios is not more than one, i.e., is one (NO at S213), the second determining unit 18g determines the detected rotation frequency ratio as a rotation frequency ratio $C_0$ at which the fans 3a and 3b are rotated (S214), and stores a processing result in the RAM 16, and the process returns. On the other hand, when the number of detected rotation frequency ratios is more than one (YES at S213), the second determining unit 18g determines a rotation frequency ratio closest to a rotation frequency ratio at the time of rated operation in the detected rotation frequency ratios as a rotation frequency ratio $C_0$ at which the fans 3a and 3b are rotated (S215). Then, the second determining unit 18g stores a processing result in the RAM 16, and the process returns.

Figure 14:
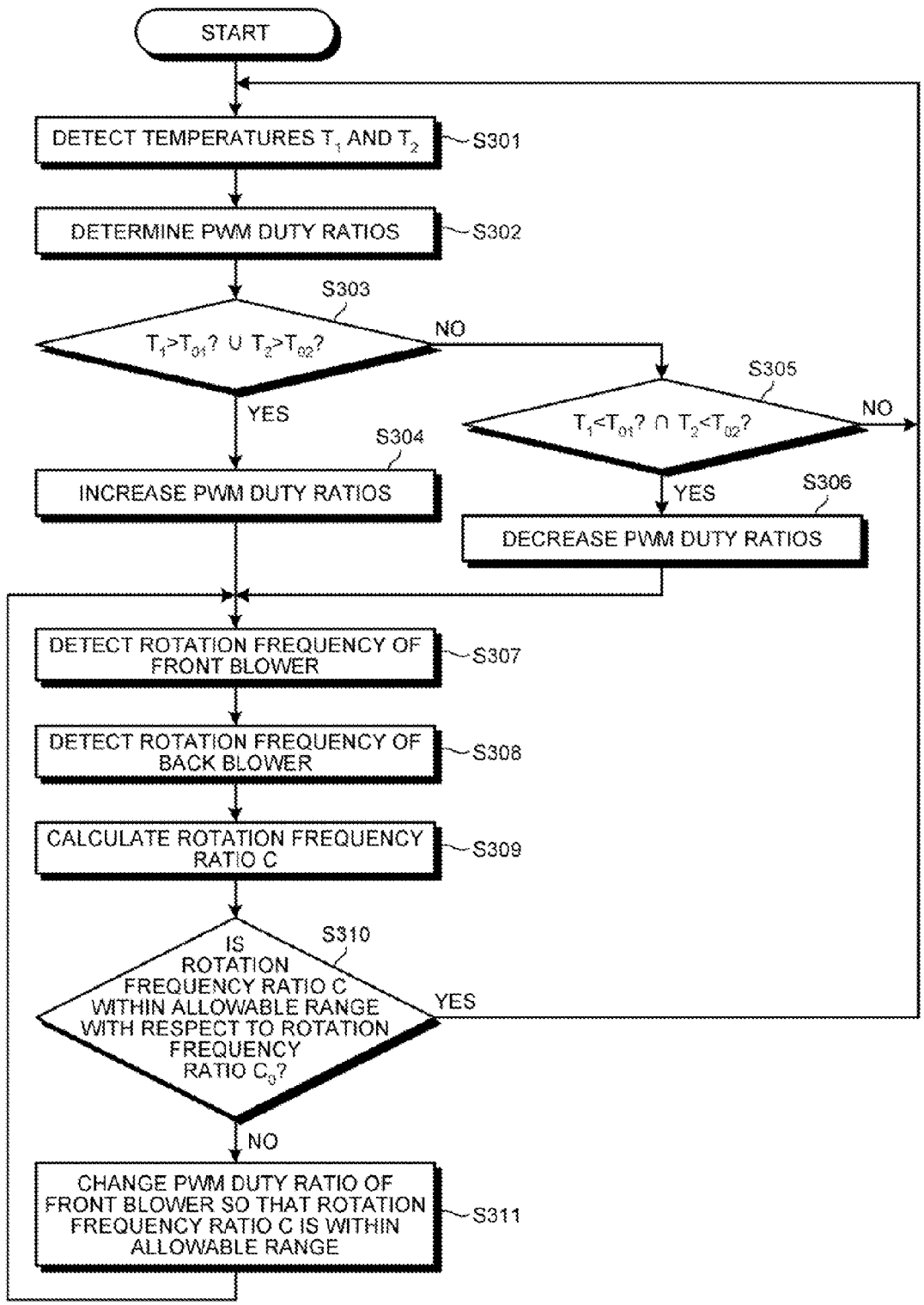
FIG. 14 is a flowchart illustrating procedures of a rotation-frequency control process according to the first embodiment.

FIG. 14 is a flowchart illustrating procedures of a rotation-frequency control process according to the first embodiment. There are various possible cases of the timing to perform the rotation-frequency control process. For example, the rotation-frequency control process is performed while the blower control device 1 is powered ON.

As illustrated in FIG. 14, the rotation-frequency control unit 18h detects a temperature $T_1$ of the heat generating body 52 and an intake-air temperature $T_2$ from the temperature sensors 11a and 11b (S301). The rotation-frequency control unit 18h determines respective PWM duty ratios of the fans 3a and 3b, and changes duty ratios to be input to the pulse generators 15a and 15b into the determined duty ratio of the fan 3a and the determined duty ratio of the fan 3b, respectively (S302).

Then, the rotation-frequency control unit 18h determines whether the temperature $T_1$ of the heat generating body 52 exceeds a preset temperature $T_{01}$ or the intake-air temperature $T_2$ exceeds a preset temperature $T_{02}$ (S303). When any of the temperature $T_1$ of the heat generating body 52 and the intake-air temperature $T_2$ exceeds the respective preset temperatures $T_{01}$ and $T_{02}$ (YES at S303), the rotation-frequency control unit 18h performs the following process. That is, the rotation-frequency control unit 18h changes each of duty ratios to be input to the pulse generators 15a and 15b so that a PWM value indicated by the duty ratio is increased by a predetermined amount (S304). Then, the process proceeds to S307 to be described below.

On the other hand, when both of the temperature $T_1$ of the heat generating body 52 and the intake-air temperature $T_2$ do not exceed the respective preset temperatures $T_{01}$ and $T_{02}$ (NO at S303), the rotation-frequency control unit 18h performs the following process. That is, the rotation-frequency control unit 18h determines whether the temperature $T_1$ of the heat generating body 52 is lower than the preset temperature $T_{01}$ and also the intake-air temperature $T_2$ is lower than the preset temperature $T_{02}$ (S305). When the temperature $T_1$ of the heat generating body 52 is equal to or higher than the preset temperature $T_{01}$ or the intake-air temperature $T_2$ is equal to or higher than the preset temperature $T_{02}$ (NO at S305), the process returns to S301. On the other hand, when the temperature $T_1$ of the heat generating body 52 is lower than the preset temperature $T_{01}$ and also the intake-air temperature $T_2$ is lower than the preset temperature $T_{02}$ (YES at S305), the rotation-frequency control unit 18h changes each of duty ratios to be input to the pulse generators 15a and 15b as follows. That is, the rotation-frequency control unit 18h changes each duty ratio so that a PWM value indicated by the duty ratio is decreased by a predetermined amount (S306).

Then, the rotation-frequency control unit 18h detects a rotation frequency Sf of the fan 3a (S307). Then, the rotation-frequency control unit 18h detects a rotation frequency Sr of the fan 3b (S308). Then, the rotation-frequency control unit 18h calculates a rotation frequency ratio C (Sr/Sf) (S309). Then, the rotation-frequency control unit 18h determines whether the ratio C is within a predetermined allowable range with respect to the rotation frequency ratio $C_0$ (a range from $(C_0-\gamma)$ to $(C_0+\gamma)$) (S310). When the ratio C is not within the allowable range (NO at S310), the rotation-frequency control unit 18h changes a duty ratio to be input to the pulse generator 15a so that the ratio C is within the allowable range (S311), and the process returns to S307. On the other hand, when the ratio C is within the allowable range (YES at S310), the process returns to S301.

As described above, when the fans 3a and 3b rotate at respective rotation frequencies for rated operation, the blower control device 1 according to the present embodiment determines an operating point $(Q_0, P_0)$ on the basis of a PQ characteristic corresponding to a ratio of the rotation frequencies for rated operation. The blower control device 1 calculates a sound pressure level $L_0$ corresponding to an air flow volume $Q_0$ indicated by the operating point determined by the first determining unit 18b on the basis of a load noise characteristic in rated operation. The blower control device 1 performs the following process on the basis of multiple PQ characteristics registered in the second table 17b, a relationship between air flow volume and static pressure which indicates a system impedance, and the operating point $(Q_0, P_0)$. That is, the blower control device 1 calculates an air flow volume $Q_N$ of air flow through the ventilation flue 51 and a static pressure $P_N$ when the fans 3a and 3b are rotating with respect to each of multiple rotation frequency ratios. The blower control device 1 changes a load noise characteristic with respect to each of the multiple rotation frequency ratios on the basis of the air flow volume $Q_0$ and the air flow volume $Q_N$ with respect to each rotation frequency ratio. The blower control device 1 calculates a noise level corresponding to the air flow volume $Q_0$ with respect to each of the multiple rotation frequency ratios on the basis of the changed load noise characteristic. The blower control device 1 determines a rotation frequency ratio corresponding to the lowest noise level out of a sound pressure level $L_0$ and multiple sound pressure levels $L_N$ as a rotation frequency ratio $C_0$ at which the fans 3a and 3b are rotated. The blower control device 1 controls respective rotation frequencies of the fans 3a and 3b so that the inside of the electronic device 50 reaches a predetermined temperature on the basis of temperatures detected by the temperature sensors 11a and 11b. At this time, the blower control device 1 controls the respective rotation frequencies of the fans 3a and 3b so that the fans 3a and 3b rotate at a ratio within a predetermined allowable range with respect to the rotation frequency ratio $C_0$ (a range from $(C_0-\gamma)$ to $(C_0+\gamma)$). In this manner, the blower control device 1 selects a rotation frequency ratio resulting in the minimum load noise taking into consideration the system impedance of the electronic device 50, a PQ characteristic of the counter-rotating fan 3 with respect to each ratio of the rotation frequencies of the fans 3a and 3b, and a load noise characteristic with respect to each rotation frequency ratio. Therefore, the blower control device 1 can further suppress noise.

The embodiment of the device according to the present invention is described above; the present invention can be embodied in various different forms other than the embodiment described above. The other embodiments included in the present invention are explained below.

For example, out of the processes described in the first embodiment, all or part of the process described as an automatically-performed one can be manually performed. For example, a user can input an instruction to perform the rotation-frequency control process via the accepting unit (not illustrated).

Furthermore, processes at steps in each process described in the above embodiment can be arbitrarily subdivided or combined depending on various loads and use conditions. Or, some steps can be bypassed. For example, the process at Step S302 illustrated in FIG. 14 can be subdivided.

Moreover, the processing order of steps in each process described in the above embodiment can be changed depending on various loads and use conditions. For example, the order of Steps S307 and S308 illustrated in FIG. 14 can be switched.

Furthermore, components of each device illustrated in the drawings are functionally conceptual ones, and do not always have to be physically configured as illustrated in the drawings. Namely, specific forms of division and integration of the components in the device are not limited to those illustrated in the drawings, and all or some of the components can be configured to be functionally or physically divided or integrated in arbitrary units depending on respective loads or use conditions. For example, the first determining unit 18b, the first calculating unit 18c, the second calculating unit 18d, the changing unit 18e, the third calculating unit 18f, and the second determining unit 18g can be integrated into a rotation-frequency-ratio determining unit anew.

[b] Second Embodiment

Blower Control Program

The various processes performed by the blower control device described in the above embodiment can be realized by causing a computer system, such as a personal computer or a workstation, to execute a program prepared in advance. An example of a computer that executes a blower control program having the same function as the blower control device described in the above first embodiment is explained below with reference to FIG. 15.

Figure 15:
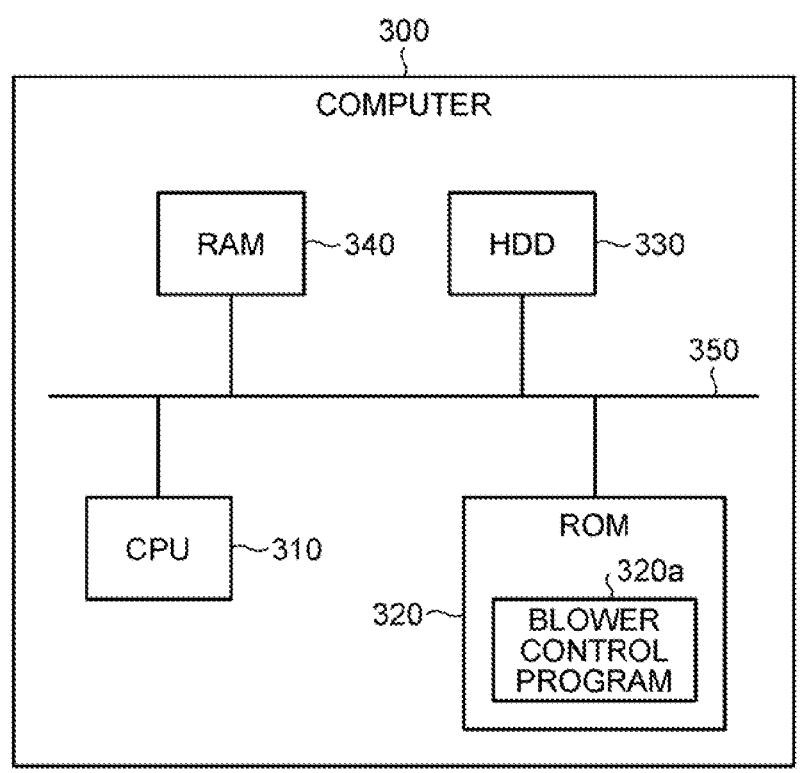
FIG. 15 is a diagram illustrating a computer that executes a blower control program.

FIG. 15 is a diagram illustrating the computer that executes the blower control program. As illustrated in FIG. 15, a computer 300 according to the second embodiment includes a central processing unit (CPU) 310, a ROM 320, an HDD 330, and a RAM 340. These units 310 to 340 are connected to one another by a bus 350.

In the ROM 320, a blower control program 320a that fulfills the same functions as the first determining unit 18b, the first calculating unit 18c, the second calculating unit 18d, the changing unit 18e, the third calculating unit 18f, the second determining unit 18g, and the rotation-frequency control unit 18h described in the first embodiment is stored in advance. Incidentally, the blower control program 320a can be arbitrarily separated into several programs. For example, the blower control program 320a can be separated into a program that fulfills the same functions as the first determining unit 18b, the first calculating unit 18c, the second calculating unit 18d, the changing unit 18e, the third calculating unit 18f, and the second determining unit 18g and a program that fulfills the same function as the rotation-frequency control unit 18h.

The CPU 310 reads out the blower control program 320a from the ROM 320, and executes the read blower control program 320a.

The HDD 330 stores therein a first table, a second table, a third table, a fourth table, system impedance information, and flow passage area information. The first table, the second table, the third table, and the fourth table correspond to the first table 17a, the second table 17b, the third table 17c, and the fourth table 17d, respectively. Furthermore, the system impedance information and the flow passage area information correspond to the system impedance information 17e and the flow passage area information 17f, respectively.

The CPU 310 reads out the first table, the second table, the third table, the fourth table, the system impedance information, and the flow passage area information, and stores the read data in the RAM 340. Then, the CPU 310 executes the blower control program 320a using the first table, the second table, the third table, the fourth table, the system impedance information, and the flow passage area information stored in the RAM 340. As for the data stored in the RAM 340, it is not necessary to store all data in the RAM 340, but only data used for the processing may be stored in the RAM 340.

Incidentally, the above-described blower control program does not always have to be stored in the ROM 320 from the beginning.

For example, the program can be stored in a "portable physical medium", such as a flexible disk (FD), a CD-ROM, a digital versatile disk, a magnet-optical disk, or an IC card, to be inserted into the computer 300. Then, the computer 300 can read out the program from such a medium and execute the read program.

Furthermore, the program can be stored in "another computer (or a server)" connected to the computer 300 via a public line, the Internet, a LAN, a WAN, or the like. Then, the computer 300 can read out the program from the computer or server and execute the read program.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A blower control device comprising:
   a memory that stores therein
   a pipeline resistance of inside of a device,
   a static pressure-air flow volume characteristic with respect to each ratio of respective rotation frequencies of a plurality of blowers arranged in series with respect to a ventilation flue formed inside the device,
   an air flow volume-noise level characteristic with respect to each of multiple different ratios of the rotation frequencies; and
   a processor coupled to the memory, wherein the processor executes a process comprising:
   determining a first air flow volume and a first static pressure of air flow through the ventilation flue on the basis of a static pressure-air flow volume characteristic corresponding to a ratio of predetermined rotation frequencies at which the blowers rotate, respectively;
   calculating a first noise level corresponding to the determined first air flow volume on the basis of an air flow volume-noise level characteristic corresponding to the ratio of the predetermined rotation frequencies;
   calculating a second air flow volume and a second static pressure of air flow through the ventilation flue when the blowers rotate at a rotation frequency ratio other than the ratio of the predetermined rotation frequencies with respect to each of the rotation frequency ratios other than the ratio of the predetermined rotation frequencies on the basis of respective static pressure air flow volume characteristics at the rotation frequency ratios other than the ratio of the predetermined rotation frequencies out of the multiple different ratios of the rotation frequencies of the blowers, a relationship between air flow volume and static pressure which indicates the pipeline resistance, and the first air flow volume and the first static pressure;
   changing an air flow volume-noise level characteristic at a rotation frequency ratio other than the ratio of the predetermined rotation frequencies with respect to each of the rotation frequency ratios other than the ratio of the predetermined rotation frequencies on the basis of the first air flow volume and the second air flow volume;
   calculating a second noise level corresponding to the first air flow volume with respect to each of the rotation frequency ratios other than the ratio of the predetermined rotation frequencies on the basis of the changed air flow volume-noise level characteristic; and
   determining a rotation frequency ratio corresponding to the lowest noise level in the first and second noise levels as a rotation frequency ratio at which the blowers are rotated.

2. The blower control device according to claim 1, wherein the changing includes changing an air flow volume-noise level characteristic at a rotation frequency ratio other than the ratio of the predetermined rotation frequencies with respect to each of the rotation frequency ratios other than the ratio of the predetermined rotation frequencies on the basis of a ratio of the second air flow volume to the first air flow volume.

3. The blower control device according to claim 1, wherein the process further comprising:
rotation-frequency controlling the respective rotation frequencies of the blowers so that the inside of the device reaches a predetermined temperature and also the blowers rotate at a ratio within a predetermined allowable range with respect to the rotation frequency ratio determined on the basis of the temperature detected by a temperature detecting unit that detects temperature of the inside of the device.

4. The blower control device according to claim 2, wherein the process further comprising:
rotation-frequency controlling the respective rotation frequencies of the blowers so that the inside of the device reaches a predetermined temperature and also the blowers rotate at a ratio within a predetermined allowable range with respect to the rotation frequency ratio determined on the basis of the temperature detected by the temperature detecting unit that detects temperature of the inside of the device.

5. A non-transitory computer-readable recording medium having stored therein a blower control program causing a computer to execute a digital signature process comprising:
determining a first air flow volume and a first static pressure of air flow through a ventilation flue on the basis of a static pressure-air flow volume characteristic corresponding to a ratio of predetermined rotation frequencies at which a plurality of blowers rotate, respectively, with reference to a storage unit that stores therein a pipeline resistance of inside of a device,
a static pressure-air flow volume characteristic with respect to each ratio of respective rotation frequencies of the blowers arranged in series with respect to the ventilation flue formed inside the device, and an air flow volume-noise level characteristic with respect to each of multiple different ratios of the rotation frequencies;
calculating a first noise level corresponding to the determined first air flow volume on the basis of an air flow volume-noise level characteristic corresponding to the ratio of the predetermined rotation frequencies;
calculating a second air flow volume and a second static pressure of air flow through the ventilation flue when the blowers rotate at a rotation frequency ratio other than the ratio of the predetermined rotation frequencies with respect to each of the rotation frequency ratios other than the ratio of the predetermined rotation frequencies on the basis of respective static pressure-air flow volume characteristics at the rotation frequency ratios other than the ratio of the predetermined rotation frequencies out of the multiple different ratios of the rotation frequencies of the blowers, a relationship between air flow volume and static pressure which indicates the pipeline resistance, and the first air flow volume and the first static pressure;
changing an air flow volume-noise level characteristic at a rotation frequency ratio other than the ratio of the predetermined rotation frequencies with respect to each of the rotation frequency ratios other than the ratio of the predetermined rotation frequencies on the basis of the first air flow volume and the second air flow volume;
calculating a second noise level corresponding to the first air flow volume with respect to each of the rotation frequency ratios other than the ratio of the predetermined rotation frequencies on the basis of the changed air flow volume-noise level characteristic; and determining a rotation frequency ratio corresponding to the lowest noise level in the first and second noise levels as a rotation frequency ratio at which the blowers are rotated.

6. The computer-readable recording medium according to claim 5, wherein the changing includes changing an air flow volume-noise level characteristic at a rotation frequency ratio other than the ratio of the predetermined rotation frequencies with respect to each of the rotation frequency ratios other than the ratio of the predetermined rotation frequencies on the basis of a ratio of the second air flow volume to the first air flow volume.

7. The computer-readable recording medium according to claim 5 causing the computer to further execute:
controlling the respective rotation frequencies of the blowers so that the inside of the device reaches a predetermined temperature and also the blowers rotate at a ratio within a predetermined allowable range with respect to the rotation frequency ratio determined on the basis of a temperature detected by a temperature detecting unit that detects temperature of the inside of the device.

8. The computer-readable recording medium according to claim 6 causing the computer to further execute:
controlling the respective rotation frequencies of the blowers so that the inside of the device reaches a predetermined temperature and also the blowers rotate at a ratio within a predetermined allowable range with respect to the rotation frequency ratio determined on the basis of a temperature detected by a temperature detecting unit that detects temperature of the inside of the device.

9. A blower control method executed by a computer, the blower control method comprising:
determining a first air flow volume and a first static pressure of air flow through a ventilation flue on the basis of a static pressure-air flow volume characteristic corresponding to a ratio of predetermined rotation frequencies at which a plurality of blowers rotate, respectively, with reference to a storage unit that stores therein a pipeline resistance of inside of a device,
a static pressure-air flow volume characteristic with respect to each ratio of respective rotation frequencies of the blowers arranged in series with respect to the ventilation flue formed inside the device, and an air flow volume-noise level characteristic with respect to each of multiple different ratios of the rotation frequencies, using a processor;
calculating a first noise level corresponding to the determined first air flow volume on the basis of an air flow volume-noise level characteristic corresponding to the ratio of the predetermined rotation frequencies, using the processor;
calculating a second air flow volume and a second static pressure of air flow through the ventilation flue when the blowers rotate at a rotation frequency ratio other than the ratio of the predetermined rotation frequencies with respect to each of the rotation frequency ratios other than the ratio of the predetermined rotation frequencies on the basis of respective static pressure-air flow volume characteristics at the rotation frequency ratios other than the ratio of the predetermined rotation frequencies out of the multiple different ratios of the rotation frequencies of the blowers,
a relationship between air flow volume and static pressure which indicates the pipeline resistance, and the first air flow volume and the first static pressure, using the processor;
changing an air flow volume-noise level characteristic at a rotation frequency ratio other than the ratio of the predetermined rotation frequencies with respect to each of the rotation frequency ratios other than the ratio of the predetermined rotation frequencies on the basis of the first air flow volume and the second air flow volume, using the processor;

calculating a second noise level corresponding to the first air flow volume with respect to each of the rotation frequency ratios other than the ratio of the predetermined rotation frequencies on the basis of the changed air flow volume-noise level characteristic, using the processor; and determining a rotation frequency ratio corresponding to the lowest noise level in the first and second noise levels as a rotation frequency ratio at which the blowers are rotated, using the processor.

10. The blower control method according to claim 9, wherein the changing includes changing an air flow volume-noise level characteristic at a rotation frequency ratio other than the ratio of the predetermined rotation frequencies with respect to each of the rotation frequency ratios other than the ratio of the predetermined rotation frequencies on the basis of a ratio of the second air flow volume to the first air flow volume.

11. The blower control method according to claim 9, further comprising:

controlling the respective rotation frequencies of the blowers so that the inside of the device reaches a predetermined temperature and also the blowers rotate at a ratio within a predetermined allowable range with respect to the rotation frequency ratio determined on the basis of a temperature detected by a temperature detecting unit that detects temperature of the inside of the device, using the processor.

12. The blower control method according to claim 10, further comprising:

controlling the respective rotation frequencies of the blowers so that the inside of the device reaches a predetermined temperature and also the blowers rotate at a ratio within a predetermined allowable range with respect to the rotation frequency ratio determined on the basis of a temperature detected by a temperature detecting unit that detects temperature of the inside of the device, using the processor.

* * * * *